(12) United States Patent
Murakami et al.

(10) Patent No.: US 6,342,418 B1
(45) Date of Patent: Jan. 29, 2002

(54) SEMICONDUCTOR DEVICE AND MANUFACTURING METHOD THEREOF

(75) Inventors: Takaaki Murakami; Kenji Yasumura, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/233,210

(22) Filed: Jan. 20, 1999

Related U.S. Application Data

(62) Division of application No. 08/919,205, filed on Aug. 28, 1997.

(30) Foreign Application Priority Data

Mar. 26, 1997 (JP) .............................................. 9-073443

(51) Int. Cl.[7] .......................................... H01L 21/8242
(52) U.S. Cl. ........................ 438/241; 438/546; 438/547; 438/548
(58) Field of Search ................................ 438/241, 546, 438/547, 548, 197

(56) References Cited

U.S. PATENT DOCUMENTS

| | | | |
|---|---|---|---|
| 4,109,371 A | 8/1978 | Shibata et al. ............... | 257/408 |
| 5,134,085 A * | 7/1992 | Gilgen et al. ............... | 438/210 |
| 5,349,225 A | 9/1994 | Redwine et al. ............ | 257/344 |
| 5,355,011 A | 10/1994 | Takata ......................... | 257/344 |
| 5,439,835 A * | 8/1995 | Gonzalez ..................... | 438/241 |
| 5,440,165 A | 8/1995 | Mitsunaga et al. ......... | 257/408 |
| 5,536,959 A | 7/1996 | Kellam ........................ | 257/327 |
| 5,691,560 A | 11/1997 | Sakakibara ................. | 257/316 |

* cited by examiner

Primary Examiner—Carl Whitehead, Jr.
Assistant Examiner—Jeff Vockrodt
(74) Attorney, Agent, or Firm—McDermott, Will & Emery

(57) ABSTRACT

An impurity concentration profile that improves pn junction breakdown voltage and mitigates the electric field, and that does not adversely affect the characteristics of a field effect transistor is realized. An n type source/drain region is formed at a silicon substrate. A p type impurity concentration profile. includes respective peak concentrations at a dope region for forming a p type well, a p type channel cut region, and a p type channel dope region. An impurity concentration profile of the n type source/drain region crosses the p type impurity concentration profile at a low concentration, and includes phosphorus implantation regions indicating impurity concentrations respectively higher than those of the p type channel cut region and the p type channel dope region and respective peaks in impurity concentration at the neighborhood of respective depth thereof. The impurity concentration profile of the n type source/drain region has a minimum point or inflection point at the region between the impurity concentration peaks of the phosphorus implantation regions.

4 Claims, 20 Drawing Sheets

SEMICONDUCTOR DEVICE AND MANUFACTURING METHOD THEREOF

This application is a divisional of application Ser. No. 08/919,205 filed Aug. 28, 1997.

BACKGROUND OF THE INVENTION

1. Field of the Invention

The present invention relates to semiconductor devices and manufacturing methods thereof. Particularly, the present invention relates to a semiconductor device having an impurity concentration profile applied to a contact region between a semiconductor substrate and a conductive layer, and a manufacturing method thereof.

2. Description of the Background Art

In accordance with the recent significant increase in the integration density of a semiconductor integrated circuit device, microminiaturization of elements has evolved rapidly. Particularly in a dynamic random access memory (DRAM) which is one semiconductor memory device, the integration density of the memory is increased corresponding to increase in the storage capacity such as from 64 megabits to 256 megabits, and further to 1 gigabit. Field effect transistors and capacitors functioning as active elements constituting a highly integrated memory must have miniaturized structures. The diameter of the contact with the impurity region of a semiconductor substrate is also reduced corresponding to miniaturization of the active elements.

The leakage current flowing from the contact to the semiconductor substrate will result in a great amount in one semiconductor device as the number of contacts formed in one device becomes greater in association with the integration of the active elements. In forming a highly integrated semiconductor device, the ratio of the leakage current to the entire power consumption will take a great value. Furthermore, there is a problem that the operating voltage of an active element, for example a field effect transistor, will be limited due to a lower junction breakdown voltage at the contact caused by increase in the impurity concentration of the semiconductor substrate by scaling of active elements.

FIG. 21 is a partial sectional view of a conventional contact structure. As shown in FIG. 21, an n type impurity region 106 including n type impurities is formed having a predetermined depth from the surface of a p type silicon substrate 101. A contact hole 116 is formed in an interlayer insulation film 115 so as to expose the surface of n type impurity region 106. A conductive layer 110, for example an electrode layer, a storage node of a capacitor, is formed so as to come into contact with the surface of n type impurity region 106 through contact hole 116.

In the above contact structure, ions for preventing leakage current are implanted, if necessary, after contact hole 116 is formed. Then, a conductive material such as polycrystalline silicon having n type impurities doped is introduced into contact hole 116 to form conductive layer 110.

FIG. 22 shows the impurity concentration profile at the position of XXII of FIG. 21. As shown in FIG. 22, silicon substrate 101 has an impurity concentration profile p(B) in which boron (B) is introduced as the p type impurity. N type impurity region 106 has an impurity concentration profile n(P) in which phosphorus (P) is introduced as the n type impurity. The junction point J where the curves of these two impurity concentration profiles cross each other has a concentration of approximately $1 \times 10^{17} cm^{-3}$.

At the region of the silicon substrate including the above-described impurity concentration profile, a p type impurity region for adjusting the threshold voltage of a field effect transistor and a p type impurity region for preventing inversion, formed at a region beneath an element isolation insulation film, are formed so as to extend over an element formation region. In this case, the p type impurity concentration increases at shallow regions in the p type impurity concentration profile p(B). The position of junction point J is shifted towards a higher impurity concentration. When a voltage is applied to conductive layer 110, a depletion layer cannot easily spread since the impurity concentration is great at the pn junction to induce the possibility of electric field concentration. Particularly, the problem of reduction in the junction breakdown voltage due to increase in the impurity concentration at the pn junction is noted. There was also the problem of a greater leakage current in the contact structure due to increase in the impurity concentration at the pn junction.

U.S. patent application Ser. No. 08/709,592 discloses a contact structure for preventing reduction in the junction breakdown voltage and increase in leakage current.

FIG. 23 is a partial sectional view of a contact structure disclosed in the aforementioned application. Referring to FIG. 23, a p type well formation dope region 103, a p type channel cut region (inversion prevention region) 104, and a p type channel dope region 105 (for adjusting threshold voltage) with respective predetermined depth are formed at a p type silicon substrate 101. An n type impurity region. 106 is formed at p type silicon substrate 101. A contact hole 116 exposing the surface of n type impurity region 106 is formed in an interlayer insulation layer 115. A conductive layer 110 is formed so as to come into contact with the surface of n type impurity region 106 via contact hole 116.

FIG. 24 shows an impurity concentration profile at a position XXIV of FIG. 23. As shown in FIG. 24, a p type impurity concentration profile p(B) includes impurity concentration peaks respectively corresponding to p type well formation dope region 103, p type channel cut region 104, and p type channel dope region 105. An n type impurity concentration profile n(P)exhibits values higher than the respective impurity concentrations of p type channel cut region 104 and p type channel dope region 105 at predetermined depth thereof. N type impurity concentration profile n(P) has a junction point J in the proximity of a minimum value X of p type impurity concentration profile p(B).

As described above, the position of the pn junction is located at a low impurity concentration level in both the n type impurity concentration profile n(P) and p type impurity concentration profile p(B). Therefore, in comparison to the case where junction point J is located at a high impurity concentration level, the depletion layer is easily depleted to exhibit a greater expansion even when the voltage applied to conductive layer 110 is identical. The junction does not break down until the voltage applied to the contact becomes higher. Therefore, the junction breakdown voltage is improved. As a result, the electric field generated at the pn junction is mitigated to reduce the leakage current generated at the contact region.

FIG. 25 is a partial sectional view of a memory portion of a DRAM in which an impurity concentration profile as shown in FIG. 24 is applied. Referring to FIG. 25, a gate electrode 109 is formed on a p type silicon substrate 101 with a gate insulation film 108 thereunder. A pair of n type source/drain regions 106 and 107 are formed at a surface region of silicon substrate 101 at both sides of gate electrode 109. A storage node 110 is formed so as to come into contact with the surface of one source/drain region 106. A dielectric film 111 is formed so as to cover the surface of storage node 110. A cell plate 112 is formed so as to cover the surface of dielectric film 111. A capacitor is formed of storage node 110, dielectric film 111, and cell plate 112. A bit line 113 is formed so as to come into contact with the other source/drain region 107. Storage node 110 comes into contact with n type source/drain region 106 through a contact hole 116 formed in an interlayer insulation film 115. N type source/drain region 106 is formed of a region into which arsenic (As) is introduced, and a region including phosphorus (P) provided to improve the breakdown voltage of the pn junction and to suppress leakage current, as described above.

FIG. 26 shows the impurity concentration profile at a position XXVI of FIG. 25. As shown in FIG. 26, a p type impurity concentration profile p(B) has respective impurity concentration peaks corresponding to p type well formation dope region 103, p type channel cut region 104, and p type channel dope region 105. An n type impurity concentration profile n(P) exhibits an impurity concentration at the position between p type channel cut region 104 and p type channel dope region 105 higher than respective values thereat. N type impurity concentration profile n(P) has a pn junction point J in the proximity of a minimum value X of p type impurity concentration profile p(B). Thus, the junction breakdown voltage is improved, and the leakage current due to electric field mitigation is reduced. In FIG. 26, an n type impurity concentration profile n(As) in which arsenic (As) is introduced to form the original source/drain region is also shown.

In the memory portion of a DRAM having an impurity concentration profile as shown in FIG. 26, miniaturization of the field effect transistor is advanced according to increase of the storage capacity. In a DRAM having a memory capacity of approximately 1 gigabit, the gate has a length L of approximately 0.15 $\mu$m in the field effect transistor shown in FIG. 25. The distance D between the sidewall of contact hole 116 and the sidewall of gate electrode 109 becomes as small as 0.075 $\mu$m. In accordance with miniaturization of a field effect transistor, p type channel dope region 105 is formed so as to have a shallow and abrupt concentration gradient in FIG. 26. Therefore, as shown by the arrow in FIG. 26, n type source/drain region 106 is formed to have an n type impurity concentration profile n(P) exhibiting a higher impurity concentration at the shallow region. As a result, the region of n type source/drain region 106 where phosphorus (P) is introduced to mitigate the electric field and to improve the junction breakdown voltage is formed so as to have a higher concentration at the shallow region and to spread laterally as indicated by the chain line with two dots in FIG. 25.

The formation of the above n type source/drain region 106 induces problems set forth in the following.

The lateral spread of n type source/drain region 106 indicated by the chain line with two dots in FIG. 25 causes the field effect transistor to be easily turned on at a threshold voltage lower than that of the designed value. In other words, the characteristic of the field effect transistor is altered. For example, the threshold voltage is reduced. As a result, electrons of storage node 110 will easily leak out.

Also, alteration in distance D in FIG. 25 causes variation in the level of the effect of the spread of n type source/drain region 106 indicated by the chain line with two dots on the characteristics of the field effect transistor. This means that the characteristics of the field effect transistor is altered by variation in the position of contact hole 116. Therefore, the characteristics of the field effect transistor is altered by variation in the step of forming contact hole 116 and the manufacturing process conditions. In other words, the characteristics of the field effect transistor is susceptible to the variation in the formation position of storage node 116.

SUMMARY OF THE INVENTION

An object of the present invention is to provide an impurity concentration profile that allows improvement of the breakdown voltage of the pn junction while mitigating the electric field to reducte leakage current without deteriorating the characteristics of a field effect transistor.

Another object of the present invention is to improve pn junction breakdown voltage at a contact of the storage node side of a DRAM, and to mitigate the electric field to reduce leakage current without deteriorating the characteristic of a field effect transistor.

A further object of the present invention is to easily form an impurity concentration profile that allows improvement of pn junction breakdown voltage, and mitigation of the electric field to reduce leakage current without deteriorating the characteristic of a field effect transistor.

A semiconductor device according to an aspect of the present invention includes a semiconductor substrate of a first conductivity type with a main surface, and an impurity region of a second conductivity type formed to have an impurity concentration profile of the second conductivity type extending from the main surface of the semiconductor substrate in the direction of the depth. The semiconductor substrate has an impurity concentration profile of the first conductivity type extending from the main surface in the direction of depth. The first conductivity type impurity concentration profile includes a first maximum point of an impurity concentration at a first depth from the main surface, a second maximum point of an impurity concentration at a second depth that is deeper than the first depth, and a low concentration region indicating an impurity concentration lower than the first and second maximum points at a region deeper than the second depth. The second conductivity type impurity concentration profile forms a junction point at the low concentration region crossing the first conductivity type impurity concentration profile, and includes a second conductivity type impurity concentration at a region from the main surface to the junction point, higher than the impurity concentration indicated by the first conductivity type impurity concentration profile. The second conductivity type impurity concentration profile has a minimum point or an inflection point at a region between the first depth and the second depth.

In the semiconductor device having the above-described structure, the second conductivity type impurity concentration profile forms a junction point crossing the first conductivity type impurity concentration profile at a region of a lower impurity concentration. Therefore, the pn junction breakdown voltage can be improved, the electric field mitigated, and the leakage current reduced. In the semiconductor device of the present invention, the second conductivity type impurity concentration profile has a second conductivity type impurity concentration higher than the impurity concentration indicated by the first conductivity type impurity concentration profile in a region from the main surface to the junction point, and a minimum point or an inflection point at a region between the first depth and the second depth. The presence of this minimum point or inflection point provides the advantage of suppressing the effect of the second conductivity type impurity concentration profile having a higher impurity concentration on the gate electrode formation region of the field effect transistor. As a result, the characteristics of the field effect transistor will not change. For example, the threshold voltage of the field effect transistor will not be reduced.

According to a semiconductor device of the present aspect, the first conductivity type impurity concentration profile preferably includes a third maximum point of an impurity concentration at a third depth deeper than the junction point.

Furthermore, the second conductivity type impurity concentration profile preferably includes a first maximum point of the impurity concentration in the proximity of the first depth, and a second maximum point of the impurity concentration in the proximity of the second depth.

In this case, the first and second maximum points of the second conductivity type impurity concentration profile preferably have an impurity concentration respectively greater than the first and second maximum points of the first conductivity type impurity concentration profile.

Accordingly, an impurity concentration profile can easily be formed that allows improvement of the breakdown voltage at the pn junction and that allows mitigation of the electric field without adversely affecting the characteristics of the field effect transistor.

Further preferably, the first, second, and third maximum points of the first conductivity type impurity concentration profile indicate respective peak concentrations of the impurity region for adjusting the threshold voltage of the field effect transistor, the impurity region for preventing inversion, and the impurity region for forming a well.

Further preferably, a semiconductor device according to an aspect of the present invention includes a field effect transistor. The field effect transistor includes a gate electrode, and first and second source/drain regions of the second conductivity type. The gate electrode is formed above the main surface of the semiconductor substrate with a gate insulation film thereunder. The first and second source/drain regions are formed at the main surface of the semiconductor substrate at both sides of the gate electrode. The first source/drain region includes the above second conductivity type impurity region. Also, the semiconductor device includes a conductive layer formed so as to come into contact with the first source/drain region.

In a semiconductor device of the above-described structure, the characteristics of the field effect transistor is not susceptible to the impurity concentration profile of the first source/drain region to result in variation in the characteristics of the field effect transistor. For example, the threshold voltage of the field effect transistor will not be reduced. As a result, electrons in the conductive layer formed in contact with the first source/drain region, for example in the storage node of a capacitor, is prevented from leaking.

In the semiconductor device of the above-described structure, influence of the second conductivity impurity concentration profile on the field effect transistor due to variation in the position of the contact hole for forming a conductive layer in contact with the first source/drain region is suppressed. Therefore, the characteristics of the field effect transistor will not be altered by variation in the manufacturing process.

The semiconductor device of the above-described structure preferably includes an impurity region for adjusting the threshold voltage at a region of the semiconductor substrate below the gate electrode. The peak concentration of this impurity region corresponds to the first maximum point of the first conductivity type impurity concentration profile.

The above conductive layer preferably constitutes the electrode of a capacitor formed so as to come into contact with the first source/drain region.

The semiconductor device of the above-described structure preferably includes an element isolation insulation film for electrically isolating the field effect transistor, and an impurity region for preventing inversion at a region of the semiconductor substrate beneath the element isolation insulation film. The peak concentration of the impurity region corresponds to the second maximum point of the first conductivity type impurity concentration profile.

A method of manufacturing a semiconductor device according to another aspect of the present invention includes the following steps.

(a) Forming an element isolation insulation film at a main surface of a semiconductor substrate of a first conductivity type.

(b) A first implantation step of ion-implanting impurities of the first conductivity type at a first dose from the main surface to a first depth so as to form an impurity region of the first conductivity type for preventing inversion at a region of the semiconductor substrate beneath the element isolation insulation film.

(c) A second implantation step of ion-implanting impurities of the first conductivity type at a second dose to a second depth smaller than the first depth so as to form an impurity region of first conductivity type for adjusting the threshold voltage at a region of the semiconductor substrate between the element isolation insulation films.

(d) Forming a gate electrode at a region of the semiconductor substrate between the element isolation insulation films with a gate insulation film thereunder.

(e) Forming first and second source/drain regions of a second conductivity type at a main surface of the semiconductor substrate at both sides of the gate electrode.

(f) A third implantation step of ion-implanting impurities of the second conductivity type at a third dose attaining an impurity concentration higher than that by the first dose at the neighborhood of the first depth from the surface in the first source/drain region.

(g) A fourth implantation step of ion-implanting impurities of the second conductivity type at the fourth dose attaining an impurity concentration higher than that by the second dose at the neighborhood of the second depth from the main surface at the first source/drain region.

In the above method of manufacturing a semiconductor device of the present invention, an impurity concentration profile can easily be realized that can improve the pn junction breakdown voltage and mitigate the electric field, and that does not adversely affect the characteristics of the field effect transistor, without using any complicated manufacturing process.

The method of manufacturing a semiconductor device according to the present aspect further includes a fifth implantation step of ion-implanting impurities of the first conductivity type at a third depth deeper than the first depth so as to form a well region of the first conductivity type, prior to the first implantation step.

The above method of manufacturing a semiconductor device can further include a step of forming a conductive layer so as to come into contact with the first source/drain region.

The third and fourth implantation steps of the above method of manufacturing a semiconductor device are preferably effected by ion-implanting impurities through a contact hole formed so as to expose the surface of the first source/drain region.

According to the semiconductor device of the present invention, an impurity concentration profile can be implemented that allows improvement in the breakdown voltage of the pn junction, and that allows reduction of the leakage current by mitigating the electric field. The characteristic of the field effect transistor is not deteriorated by that impurity concentration profile. For example, a threshold voltage as designed can be maintained. As a result, leakage is suppressed of electrons from the storage node connected to the source/drain region. Furthermore, the characteristics of the electric field transistor will not be altered by variation in the position of the contact hole that forms contact with the source/drain region. This means that the characteristic of the field effect transistor is not altered by variation in the conditions of the manufacturing process.

According to a method of manufacturing a semiconductor device of the present invention, the above impurity concentration profile can easily be realized without employing a complicated manufacturing process.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
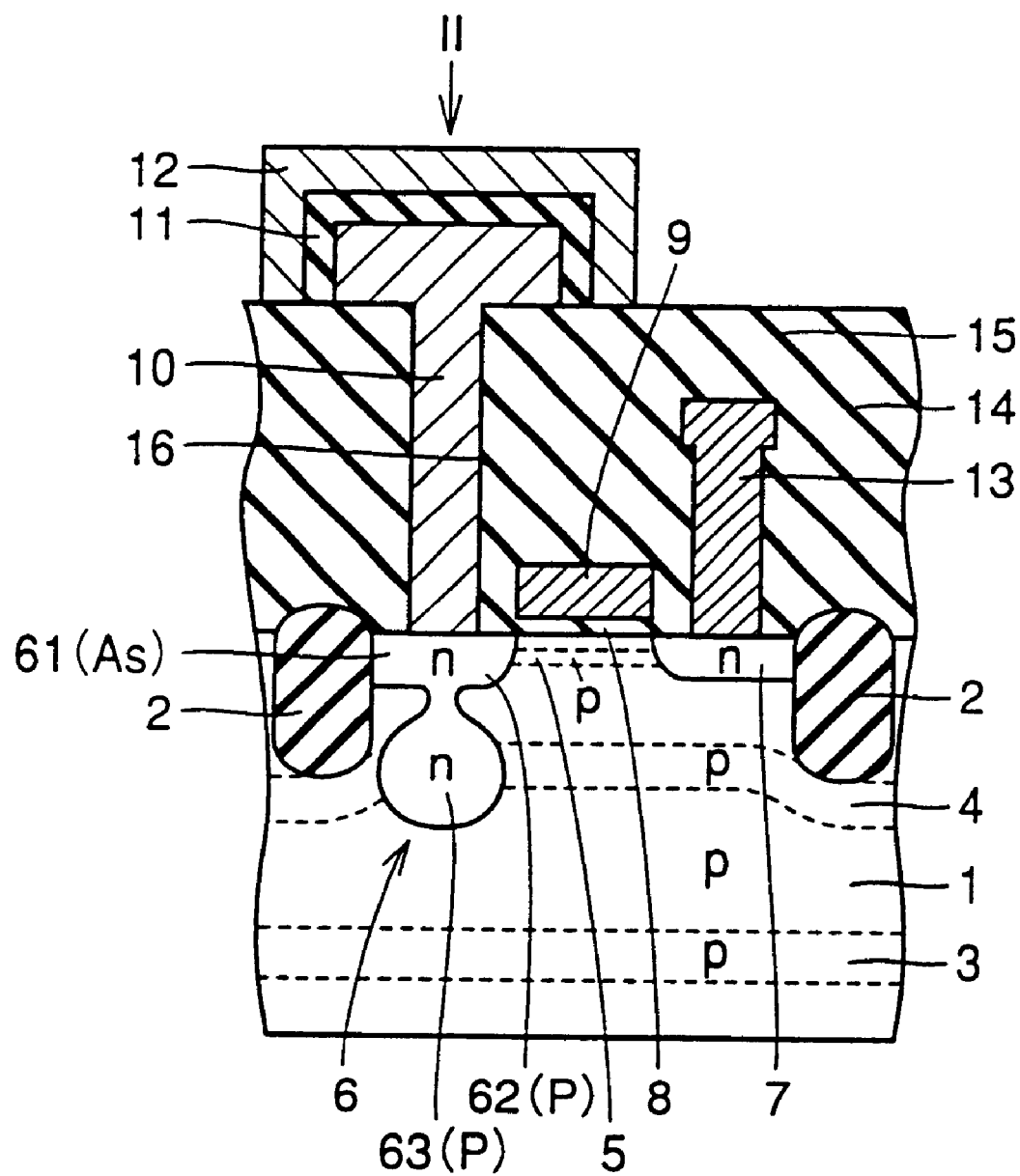
FIG. 1 is a partial sectional view of a structure of a semiconductor device according to a first embodiment of the present invention.

Referring to FIG. 1, an isolation insulation film 2 of a trench structure is formed on a main surface of a p type silicon substrate 1. A p type well formation dope region 3, a p type channel cut region (inversion prevention region) 4, and a p type channel dope region 5 (for adjusting threshold voltage) are formed at respective predetermined depth in silicon substrate 1. A gate electrode 9 is formed above silicon substrate 1 with a gate oxide film 8 thereunder. N type source/drain regions 6 and 7 are formed at the main surface of silicon substrate I at both sides of gate electrode 9. N type source/drain region 6 is formed of an arsenic implantation region 61 at the neighborhood of the main surface of silicon substrate 1, a phosphorus implantation region 62, and a phosphorus implantation region 63. A storage node 10 is formed so as to come into contact with the surface of n type source/drain region 6. Storage node 10 is formed of a polysilicon film in which phosphorus (P) is doped. Storage node 10 is formed so as to come into contact with the surface of n type source/drain region 6 through contact hole 16 formed in an interlayer insulation film 15. A dielectric film 11 is formed so as to cover the surface of storage node 10. A cell plate 12 is formed so as to cover the surface of dielectric film 11. Thus, the capacitor connected to n type source/drain region 6 is formed of storage node 10, dielectric film 11, and cell plate 12. A bit line 13 is formed so as to come into contact with the surface of n source/drain region 7. N type source/drain region 7 is formed of a region in which arsenic (As) is implanted. Bit line 13 is connected to n type source/drain region 7 through a contact hole formed in interlayer insulating film 14.

Figure 2:
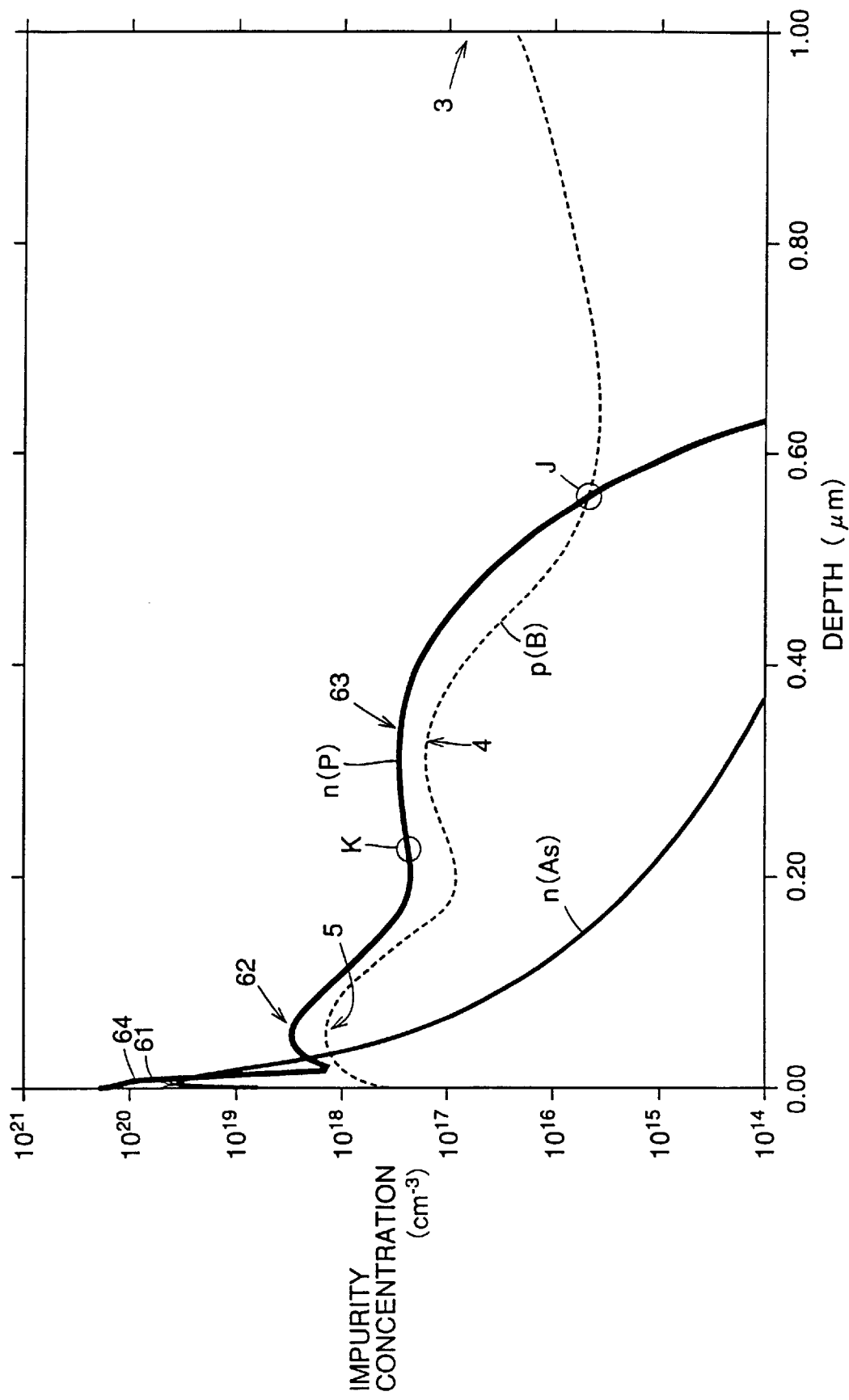
FIG. 2 shows an impurity concentration profile at a position II of FIG. 1.

Referring to FIG. 2, a p type impurity concentration profile p(B) having boron (B) implanted includes respective impurity concentration peaks corresponding to p type well formation dope region 3, p type channel cut region 4, and p type channel dope region 5. P type impurity concentration profile p(B) includes a low concentration impurity region located deeper than impurity concentration peak regions 4 and 5. In this low concentration impurity region, p type impurity concentration profile p(B) crosses an n type impurity concentration profile n(P) to form a junction point J. N type impurity concentration profile n(P) having phosphorus (P) doped has impurity concentration peaks respectively corresponding to phosphorus implantation regions 62 and 63. In n type impurity concentration profile n(P), impurity concentration peak 64 seen at the neighborhood of the surface of the silicon substrate is generated by diffusion of phosphorus (P) doped into the storage node towards the source/drain region. Arsenic implantation region 61 forming the original n type source/drain region 6 is indicated as an n type impurity concentration profile n(As).

N type impurity concentration profile n(P) crosses p type impurity concentration profile p(B) at junction point J. The impurity concentration of n type impurity concentration profile n(P) indicates a value higher than the impurity concentration of p type impurity concentration profile p(B) at a region from the surface of silicon substrate 1 to junction point J. Impurity concentration peaks 62 and 63 of n type impurity concentration profile n(P) indicate values respectively higher than those of impurity concentration peaks 5 and 4 of p type impurity concentration profile p(B). N type impurity concentration profile n(P) has a minimum point or inflection point K at a region between impurity concentration peaks 62 and 63. N type impurity concentration profile n(P) exhibits impurity concentration values higher than those of p type impurity concentration profile p(B) for also this minimum point or inflection point K. Although not shown in FIG. 2, the impurity concentration peak corresponding to p type well formation dope region 3 is located below p type impurity concentration profile p(B).

The breakdown voltage of the pn junction can be improved and the electric field mitigated by forming a junction point J of n type impurity concentration profile n(P) crossing p type impurity concentration profile p(B) at the low impurity concentration region. As a result, leakage current at the pn junction can be suppressed.

Since the n type impurity concentration profile n(P) among the impurity concentration profiles of FIG. 2 has a minimum point or an inflection point K, the spread of n type source/drain region 6 of FIG. 1, particularly the spread of phosphorus implantation region 63 will not adversely affect the region of silicon substrate 1 beneath gate electrode 9. As a result, the problem of reduction in the threshold voltage of the field effect transistor is suppressed. Therefore, electrons stored in storage node 10 connected to n type source/drain region 6 are prevented from leaking.

Furthermore, variation in the characteristics of the field effect transistor is suppressed which was conventionally caused by variation in the dimensions of the length of gate electrode 9 being extremely reduced (0.15 $\mu$m) and in the distance between the sidewalls of gate electrode 9 and contact hole 16 being reduced (0.075 $\mu$m) 2 when a DRAM is highly integrated to have a storage capacity of approximately 1 gigabit. More specifically, variation in the characteristics of the field effect transistor is suppressed which was conventionally caused by variation in the position of contact hole 16. This means that the field effect transistor is not easily susceptible to variation in the position where storage node 10 is formed. Thus, in the semiconductor device of the present invention, the field effect transistor or the capacitor in the memory region of a DRAM, for example, is not easily susceptible in characteristics to the process conditions of forming the same.

A method of manufacturing a semiconductor device according to a first embodiment of the present invention will be described hereinafter with reference to FIGS. 3–10.

Figure 3:
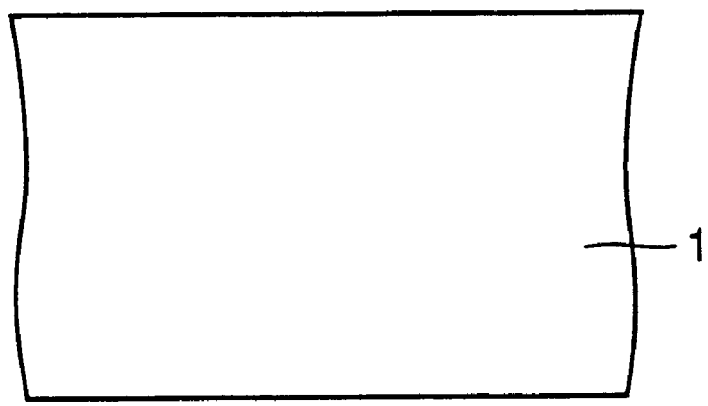
FIGS. 3–10 are partial sectional views sequentially indicating respective steps in a method of manufacturing a semiconductor device according to the first embodiment of the present invention.

Referring to FIG. 3, a p type silicon substrate 1 is prepared.

Figure 4:
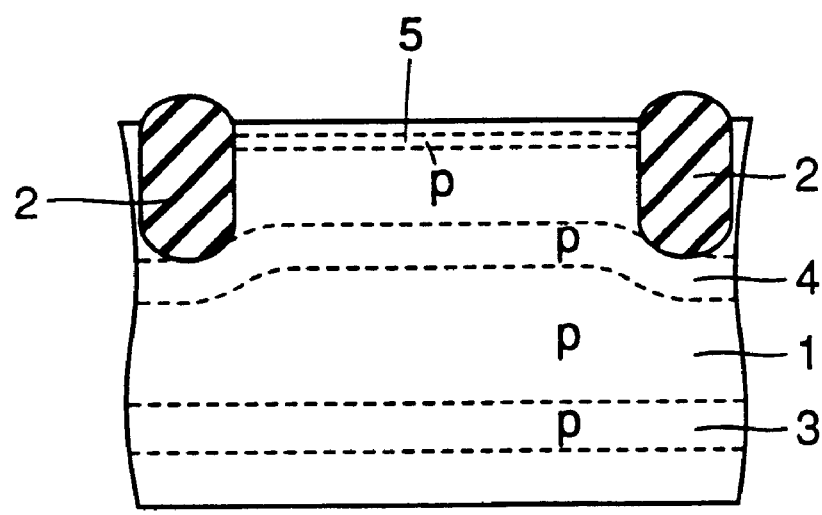

Referring to FIG. 4, a trench type isolation insulation film 2 is formed. Boron (B) ions are implanted to silicon substrate 1 at an acceleration voltage of 700 keV and a dose of $1.0 \times 10^{13}$cm$^{-2}$. As a result, a dope region 3 for forming a p type well is provided. Then, boron (B) ions are implanted to silicon substrate 1 at an acceleration voltage of 100–180 keV and a dose of $0.5 \times 10^{12}$~$8.0 \times 10^{12}$cm$^{-2}$. As a result, a p type channel cut region 4 is formed so as to come into contact with the bottom face of isolation insulation film 2. Next, boron (B) ions are implanted to silicon substrate 1 at an acceleration voltage of 10–50 keV and a dose of $1.0 \times 10^{12}$~$5.0 \times 10^{13}$cm$^{-2}$. As a result, a p type channel dope region 5 (for adjusting the threshold voltage) is formed at silicon substrate 1.

Figure 5:
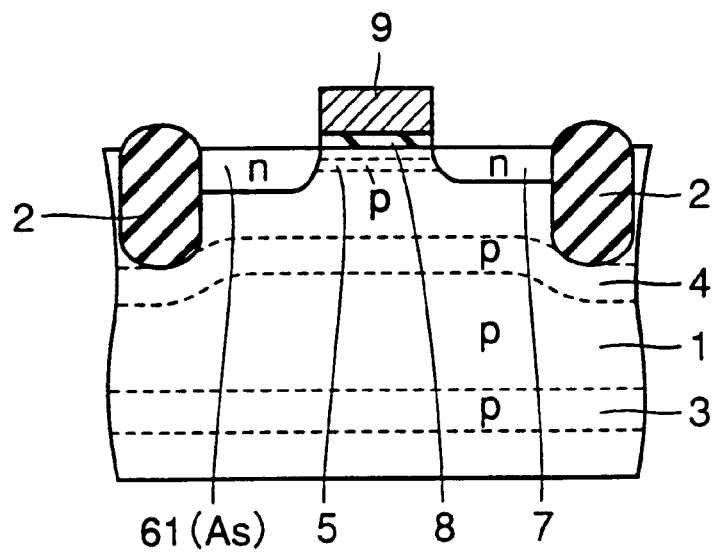

Referring to FIG. 5, a gate electrode 9 is formed on silicon substrate 1 with a gate oxide film 8 thereunder. Gate length 9 has a length of approximately 0.13–0.18 $\mu$m, and a thickness of 500–1000 Å. Gate electrode 9 is formed of polycrystalline silicon having phosphorus (P) introduced at the concentration of approximately $10^{20}$cm$^{-3}$. Gate oxide film 8 has a thickness of 50–60 Å. By implanting arsenic (As) ions into silicon substrate 1 with gate electrode 9 as a mask, an arsenic implantation region 61 of n type source/drain region 6, and an n type source/drain region 7 are formed.

Figure 6:
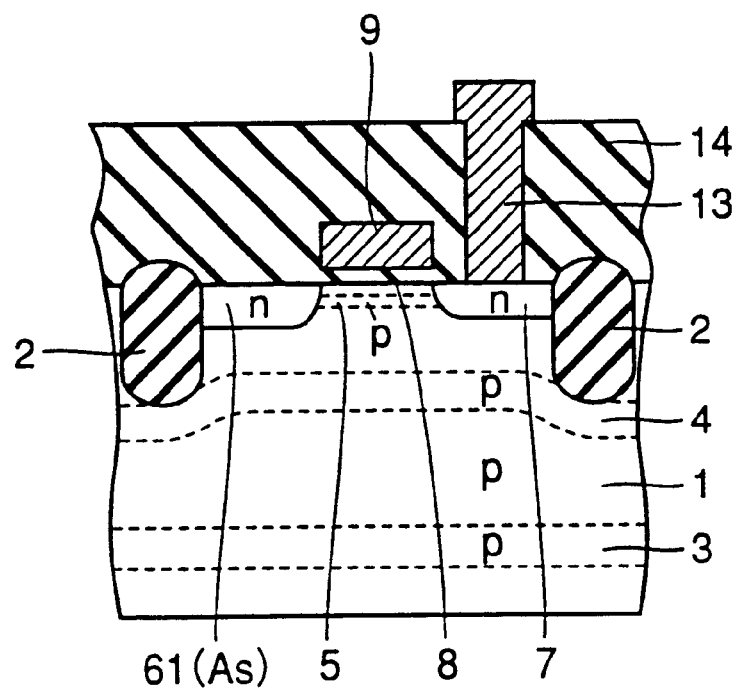

Referring to FIG. 6, an interlayer insulation film 14 is formed from the oxide film by CVD. Bit line 13 is formed so as to come into contact with the surface of n type source/drain region 7 through the contact hole formed in interlayer insulation film 14. The contact hole has a diameter of approximately 0.07–0.1 $\mu$m. Bit line 13 is formed of polycrystalline silicon having phosphorus (P) doped at the concentration of approximately $10^{20}$cm$^{-3}$.

Figure 7:
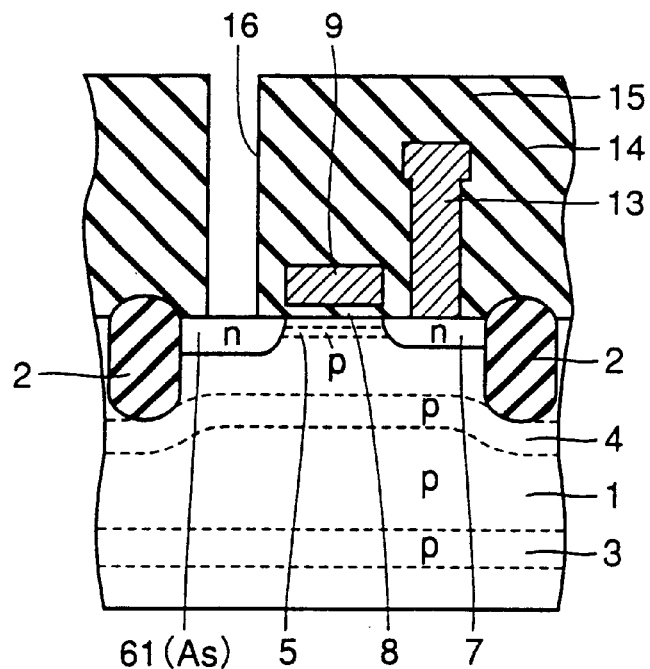

Referring to FIG. 7, an interlayer insulation film 15 is formed so as to cover bit line 13 by CVD. A contact hole 16 is formed so as to expose the surface of arsenic implantation region 61 in interlayer insulation film 15. Contact hole 16 has a diameter of approximately 0.07–0.1 $\mu$m.

Figure 8:
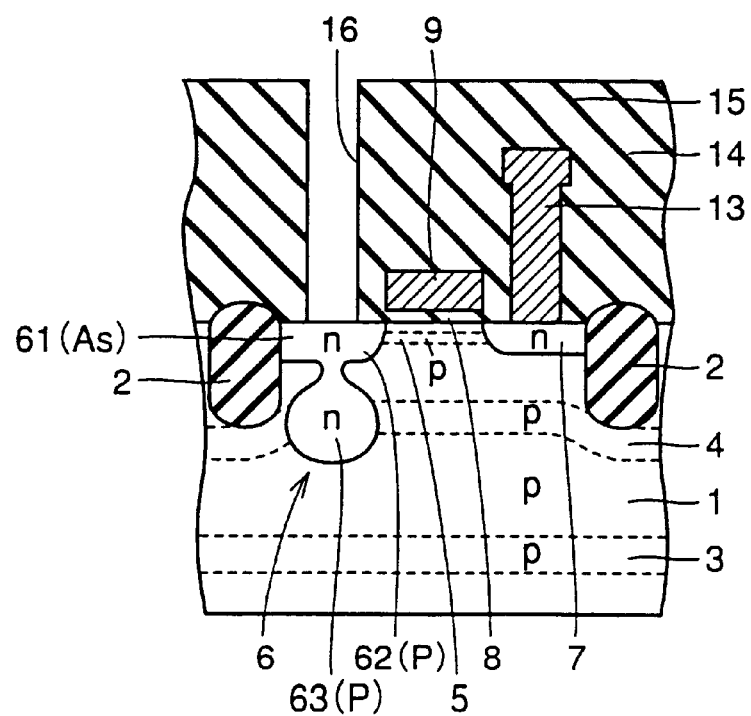

Referring to FIG. 8, phosphorus (P) ions are implanted twice through contact hole 16. At the first ion implantation, phosphorus (P) ions are implanted at an acceleration voltage of 30–50 keV and a dose of $1.0 \times 10^{13}$~$5.0 \times 10^{13}$cm$^{-2}$. This dose is set so as to be greater than the dose for forming p type channel dope region 5. As the second ion-implantation, phosphorous (P) ions are implanted at an acceleration voltage of 180–230 keV and a dose of $1.0 \times 10^{13}$~$5.0 \times 10^{13}$cm$^{-2}$. This dose is set so as to be greater than the dose for forming p type channel cut region 4. Thus, phosphorus implantation regions 62 and 63 are formed. Phosphorus implantation region 62 is formed to have an n type impurity concentration higher than the p type impurity concentration of p type channel dope region 5 at a depth approximating that of p type channel dope region 5. Phosphorus implantation region 63 is formed to have an n type impurity concentration higher than the p type impurity concentration of p type channel cut region 4 at an equal depth thereof.

Figure 9:
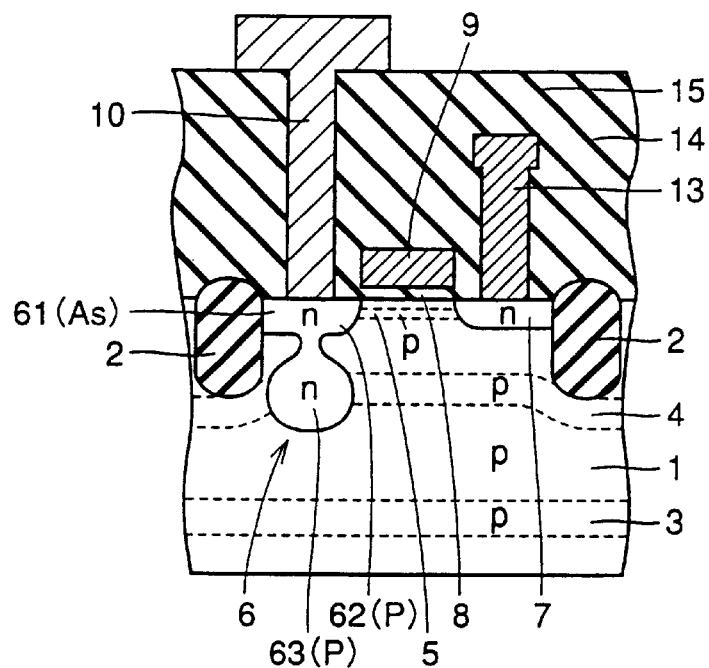

Referring to FIG. 9, a storage node 10 formed of polysilicon having phosphorus (P) doped is provided so as to come into contact with the surface of n type source/drain region 6 through contact hole 16.

Figure 10:
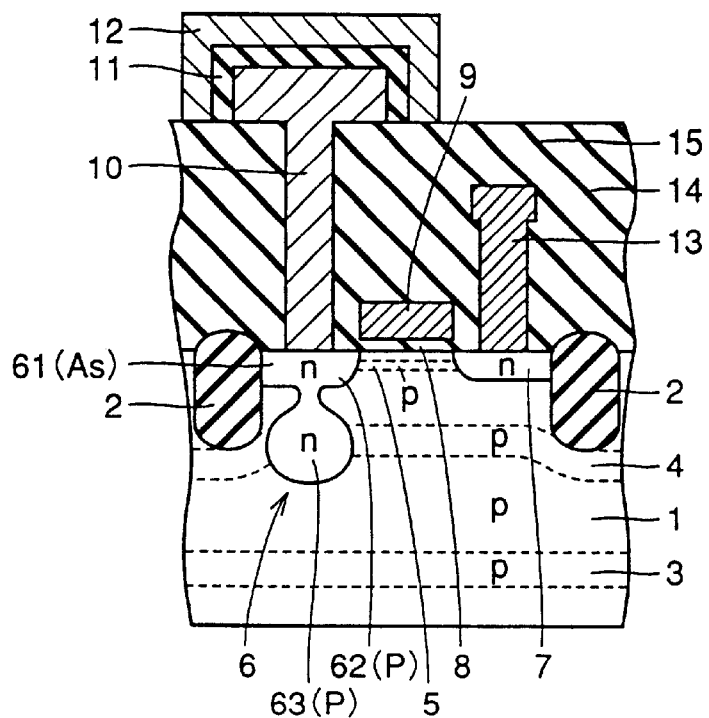

Referring to FIG. 10, a dielectric film 11 is formed so as to cover storage node 10. A cell plate 12 is formed so as to cover the surface of dielectric film 11. Thus, a capacitor connected to n type source/drain region 6 is formed.

A field effect transistor can be formed having characteristics as designed, independent of the conditions of the manufacturing process of contact hole 16 and the like, and impervious to the impurity concentration profile.

Second Embodiment

In the second embodiment, the simulation result of an impurity concentration profile of the present invention will be described.

Figure 11:
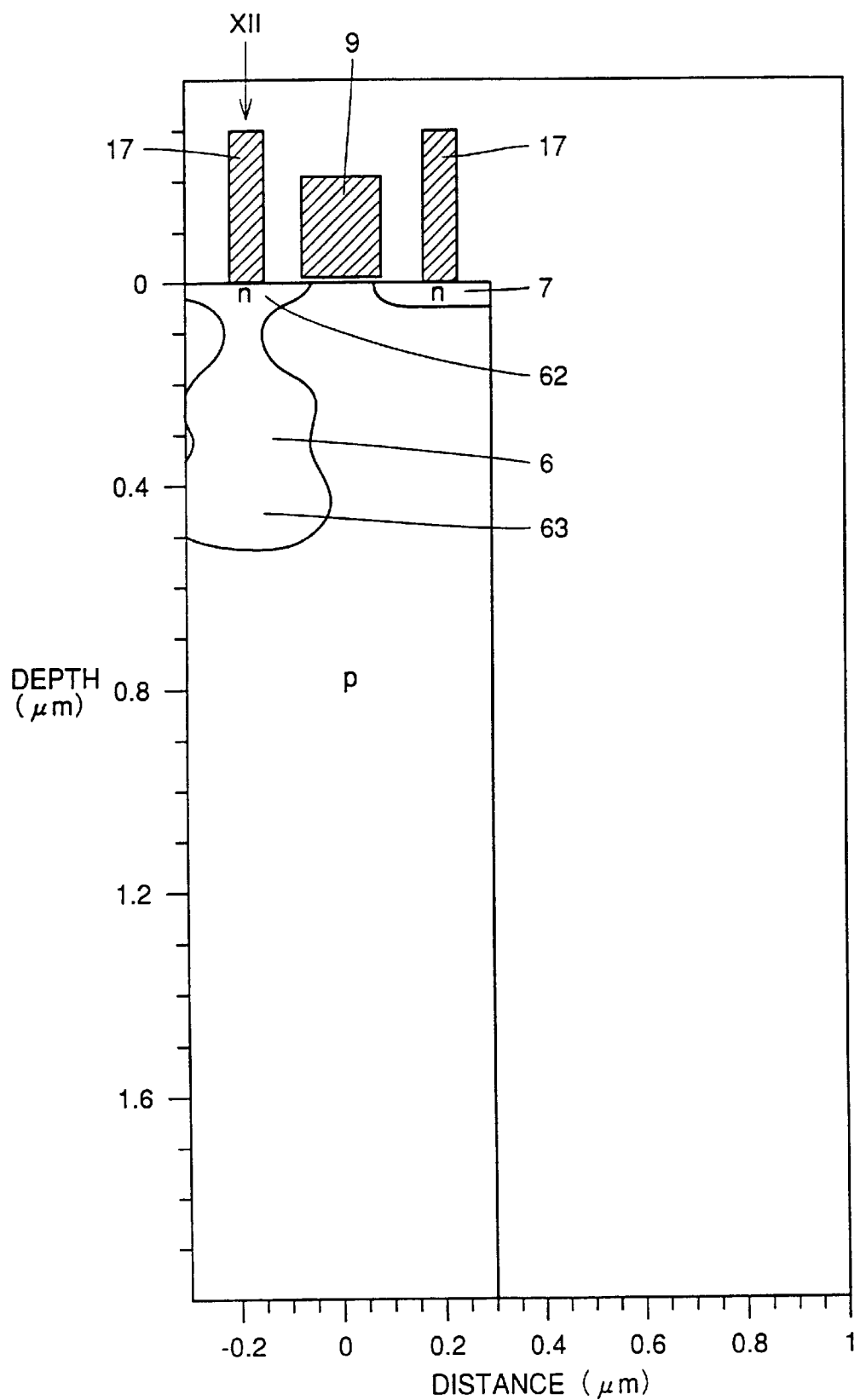
FIG. 11 is a partial sectional view showing a simulation result of a structure of a field effect transistor indicated as an implementation of the present invention in a second embodiment.
Figure 12:
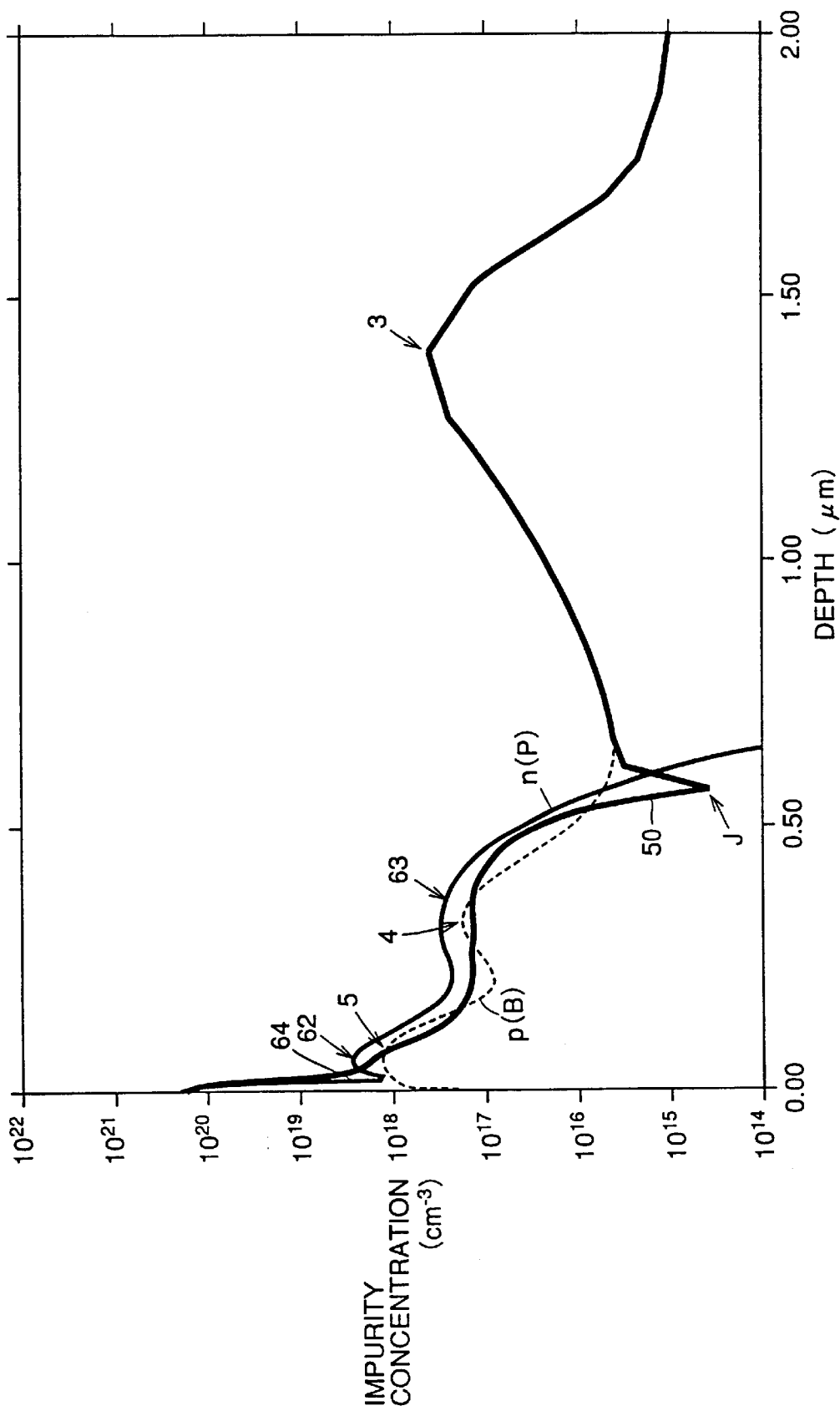
FIG. 12 shows a simulation result of an impurity concentration profile of the implementation of the present invention in the second embodiment.

FIG. 11 is a sectional view showing the simulation result of a field effect transistor having an impurity concentration profile of the present invention. FIG. 12 shows the simulation result of the impurity concentration profile at a position XII of FIG. 11.

Figure 13:
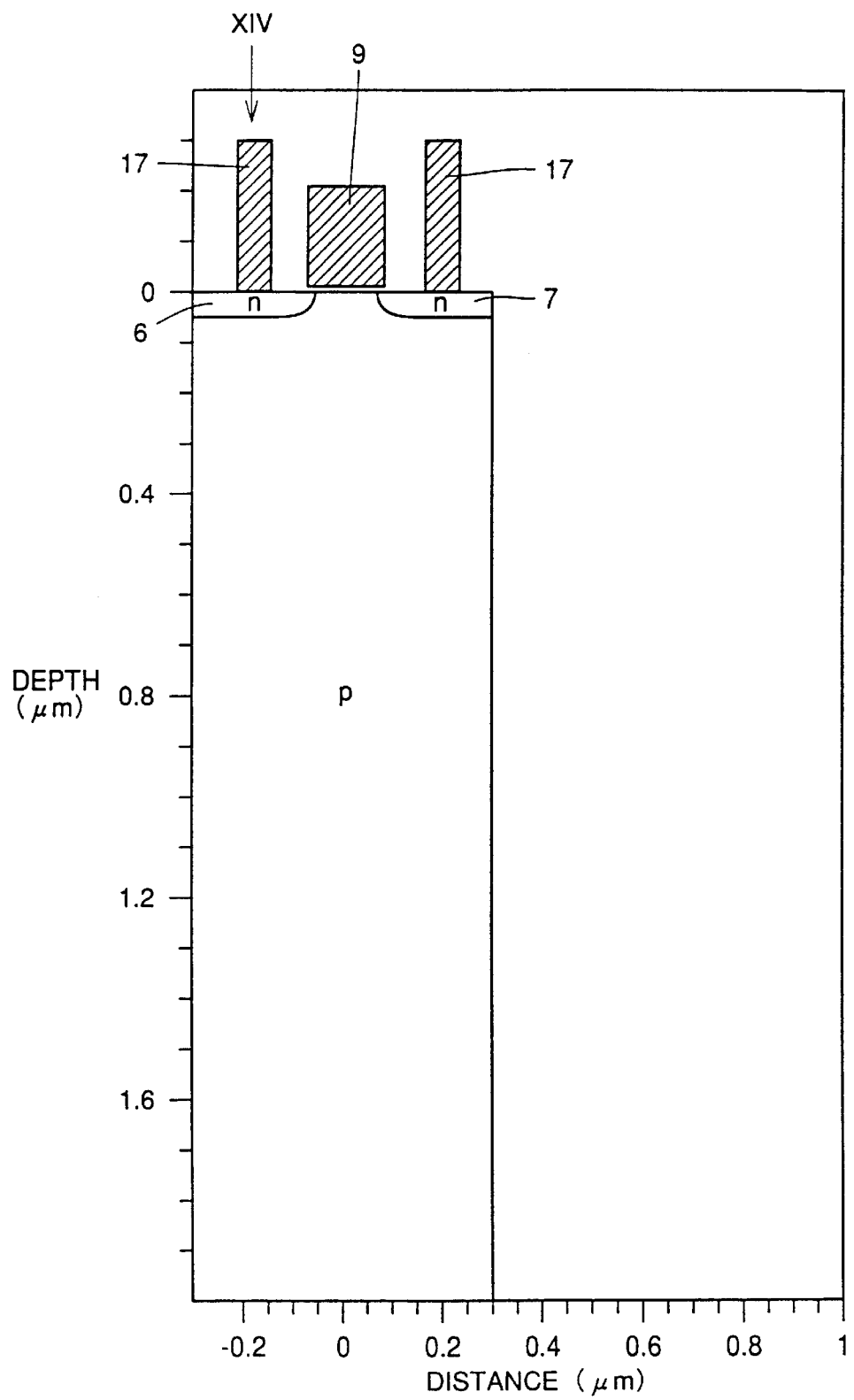
FIG. 13 is a partial sectional view showing a simulation result of a structure of a field effect transistor of a conventional implementation in the second embodiment of the present invention.
Figure 14:
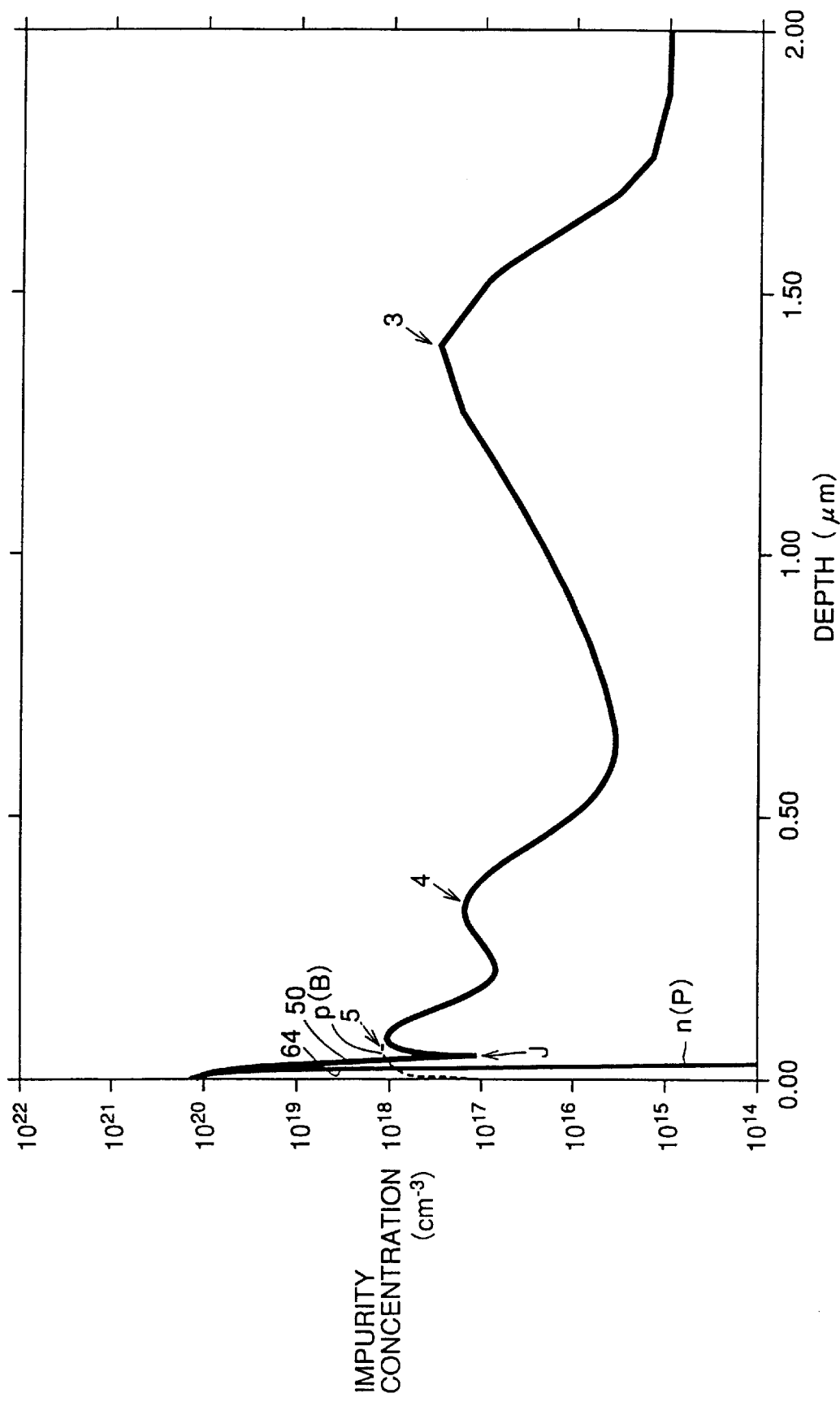
FIG. 14 shows a simulation result of an impurity concentration profile of the conventional implementation in the second embodiment of the present invention.

FIG. 13 is a sectional view showing a simulation result of a field effect transistor having a conventional impurity concentration profile. FIG. 14 shows a simulation result of an impurity concentration profile at a position XIV of FIG. 13.

Figure 15:
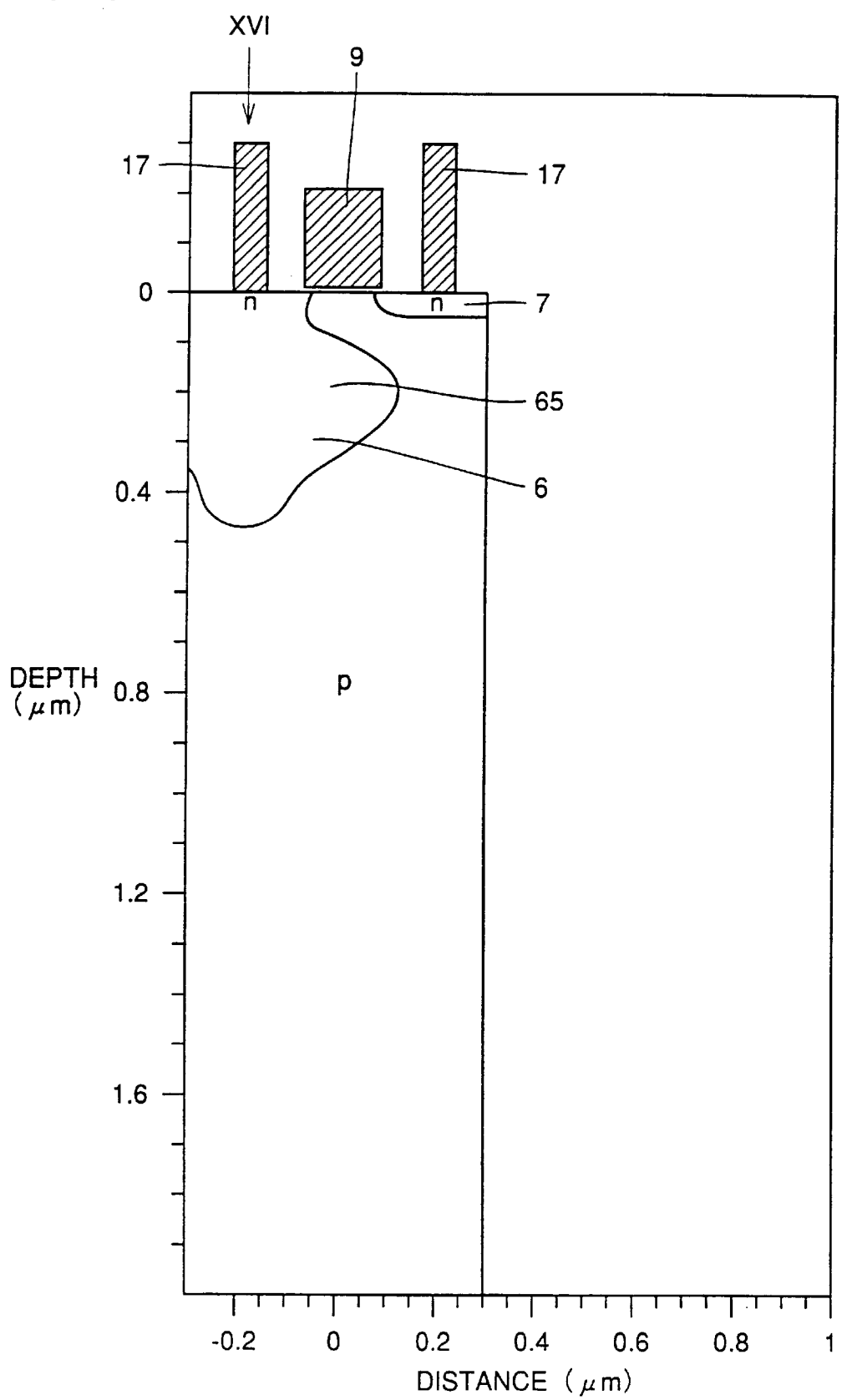
FIG. 15 is a partial sectional view showing a simulation result of a structure of a field effect transistor of a comparative implementation in the second embodiment of the present invention.
Figure 16:
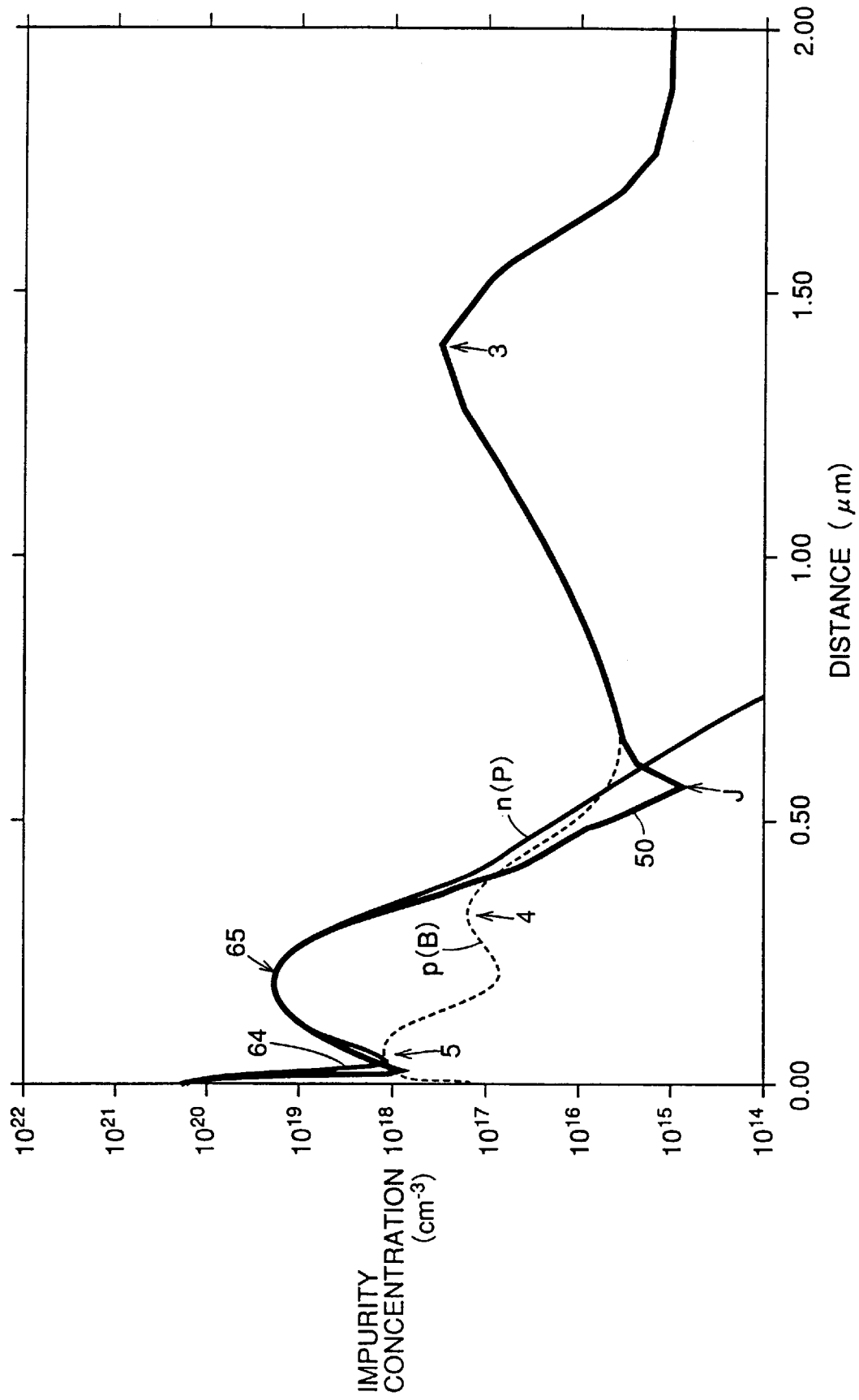
FIG. 16 shows a simulation result of an impurity concentration profile of the comparative implementation in the second embodiment of the present invention.

FIG. 15 is a sectional view showing a simulation result of a field effect transistor having an impurity concentration profile as a comparative implementation of the present invention. FIG. 16 shows a simulation result of an impurity concentration profile at a position XVI of FIG. 15.

Referring to FIGS. 11–16, a gate electrode 9 is formed on a silicon substrate with a gate insulation film thereunder. N type source/drain regions 6 and 7 are formed at the surface of the silicon substrate at both sides of the gate electrode. An electrode 17 is formed so as to be respectively connected to n type source/drain regions 6 and 7.

According to the impurity concentration profile of the present invention shown in FIG. 11, n type source/drain region 6 includes phosphorus implantation regions 62 and 63. In the neighborhood of the surface of the silicon substrate shown in FIG. 12, a region 64 to which the phosphorus ions of electrode 17 are diffused is provided. According to the conventional impurity concentration profile of FIG. 13, n type source/drain region 6 includes a phosphorus diffusion region 64 which includes phosphorus from electrode 17, as shown in FIG. 14. According to the impurity concentration profile of a comparative implementation of FIG. 15, n type source/drain region 6 includes phosphorus diffusion region 64 and phosphorus implantation region 65.

By carrying out phosphorus implantation two times in the present invention of FIGS. 11 and 12, phosphorus implantation regions 62 and 63 corresponding to two peak concentrations are formed. In the comparative implementation of FIGS. 15 and 16, phosphorus implantation region 65 indicating one impurity concentration peak is formed by the phosphorus ion implantation carried out only once.

It is to be noted that in FIGS. 12, 14 and 16, the impurity concentration profiles of arsenic implantation are not depicted. Furthermore, the carrier concentration profile which is the generic view of a p type impurity concentration p(B) and an n type impurity concentration profile n(P) is indicated as net doping 50.

In contrast to the implementation of the present invention of FIG. 12 in which pn junction point J is indicated at a region of low concentration, junction point J is seen at a shallow and high concentration region in the conventional implementation of FIG. 14. A pn junction point J is seen at a region of low concentration also in the comparative implementation of FIG. 16. Since a pn junction is indicated at a region of low concentration in the implementation of the present invention and the comparative implementation, the junction breakdown voltage can be improved. Also, leakage current can be reduced by mitigating the electric field.

However, it is to be noted that p type source/drain region 6 expands largely at the region of the silicon substrate beneath the gate electrode as shown in FIG. 15 since peak concentration 65 of the phosphorus implantation region is exhibited at a relatively shallow region in the comparative implementation of FIG. 16. Therefore, the field effect transistor is deteriorated in characteristics by the impurity concentration profile even if the junction breakdown voltage is improved and the electric field mitigated. In contrast, in the implementation of the present invention of FIG. 12, the spread of n type source/drain region 6 is small at the shallow region since there is a minimum point or an inflection point between phosphorus implantation regions 62 and 63. Therefore, the spread at the shallow region of n type source/drain region 6 is small to prevent reduction in the characteristics of the field effect transistor, as shown in FIG. 11.

The simulation results of the characteristics of a field effect transistor having respective impurity concentration profiles of the implementation of the present invention, the conventional implementation, and comparative implementation will be described hereinafter.

Figure 17:
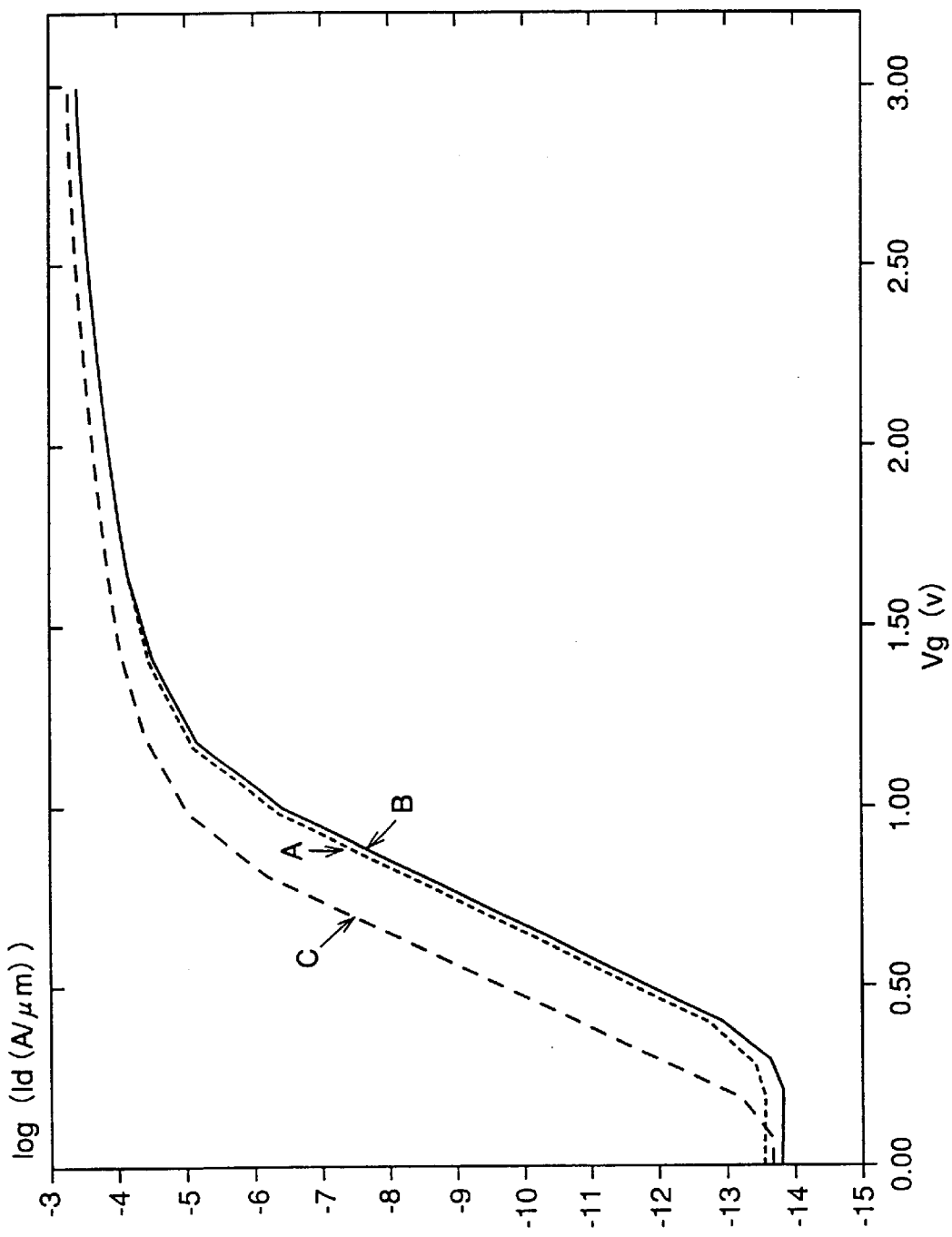
FIG. 17 shows a simulation result of gate voltage-drain current characteristics of a field effect transistor of the implementation of the present invention, conventional implementation, and comparative implementation.

FIG. 17 shows the simulation results of the gate voltage-drain current (Vg-Id) characteristics of a field effect transistor according to the implementation of the present invention (A), the conventional implementation (B) and the comparative implementation (C). It is appreciated from FIG. 17 that (A) and (B) show similar characteristics, and are impervious to the implanted phosphorus for improving junction breakdown voltage and mitigating the electric field. They show the proper gate voltage-drain current characteristics. In contrast, (C) exhibits significant increase in the drain current over increase in the gate voltage. It shows gate voltage-drain current characteristic deteriorated than the original characteristic.

Figure 18:
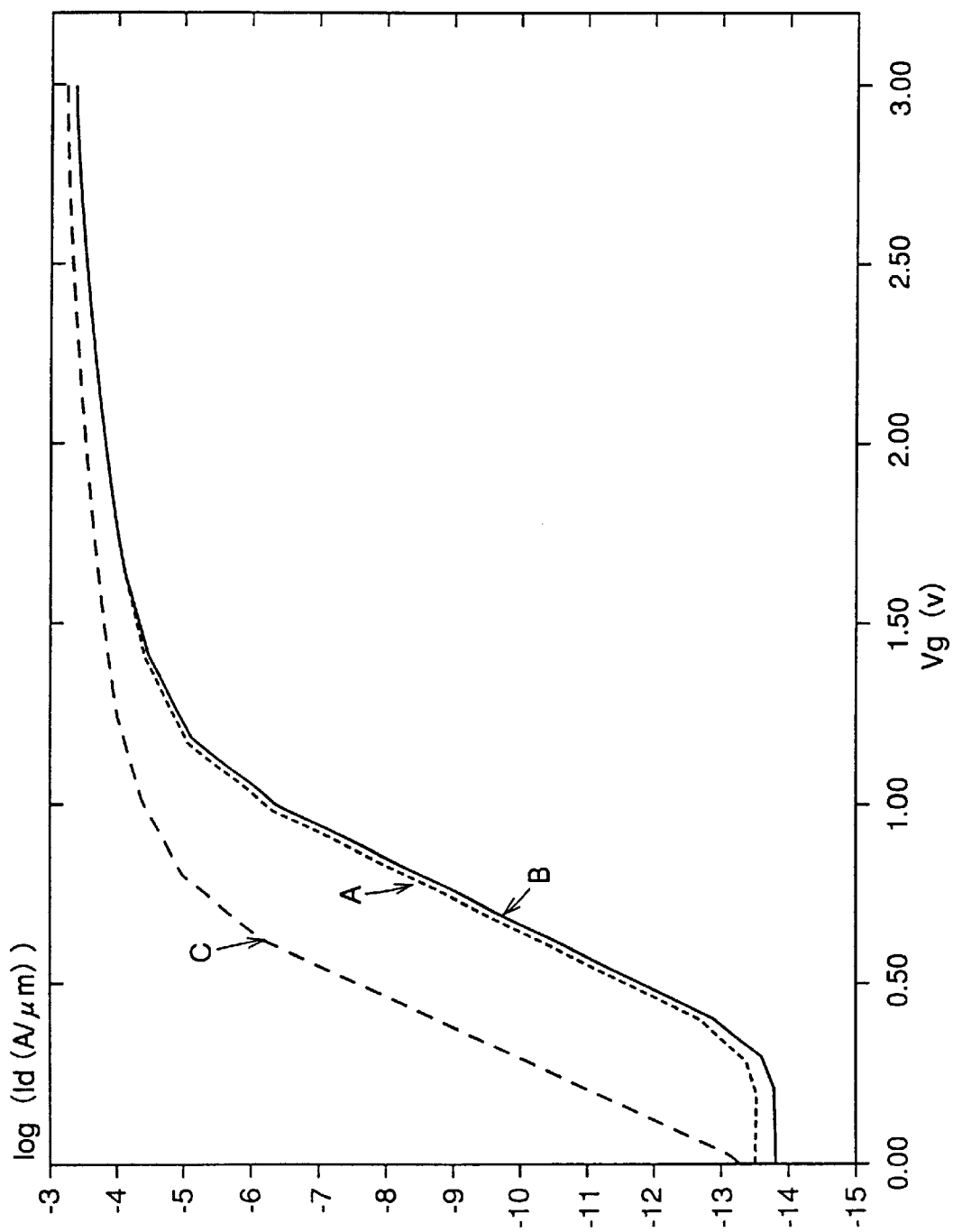
FIG. 18 shows a simulation result of gate voltage-drain current characteristics of a field effect transistor of the implementation of the present invention, conventional implementation, and comparative implementation when the position of a contact is shifted.

FIG. 18 shows the simulation results of gate voltage-drain current (Vg-Id) characteristics when the position of the contact of electrode 17 is shifted 0.025 $\mu$m towards gate electrode 9 in FIGS. 11, 13 and 15. It is appreciated from FIG. 18 that (A) maintains the proper characteristics similar to (B). However, (C) exhibits further significance in the increase of the drain current over increase of the gate voltage. It is appreciated that the gate voltage-drain current characteristic in (C) is deteriorated.

Figure 19:
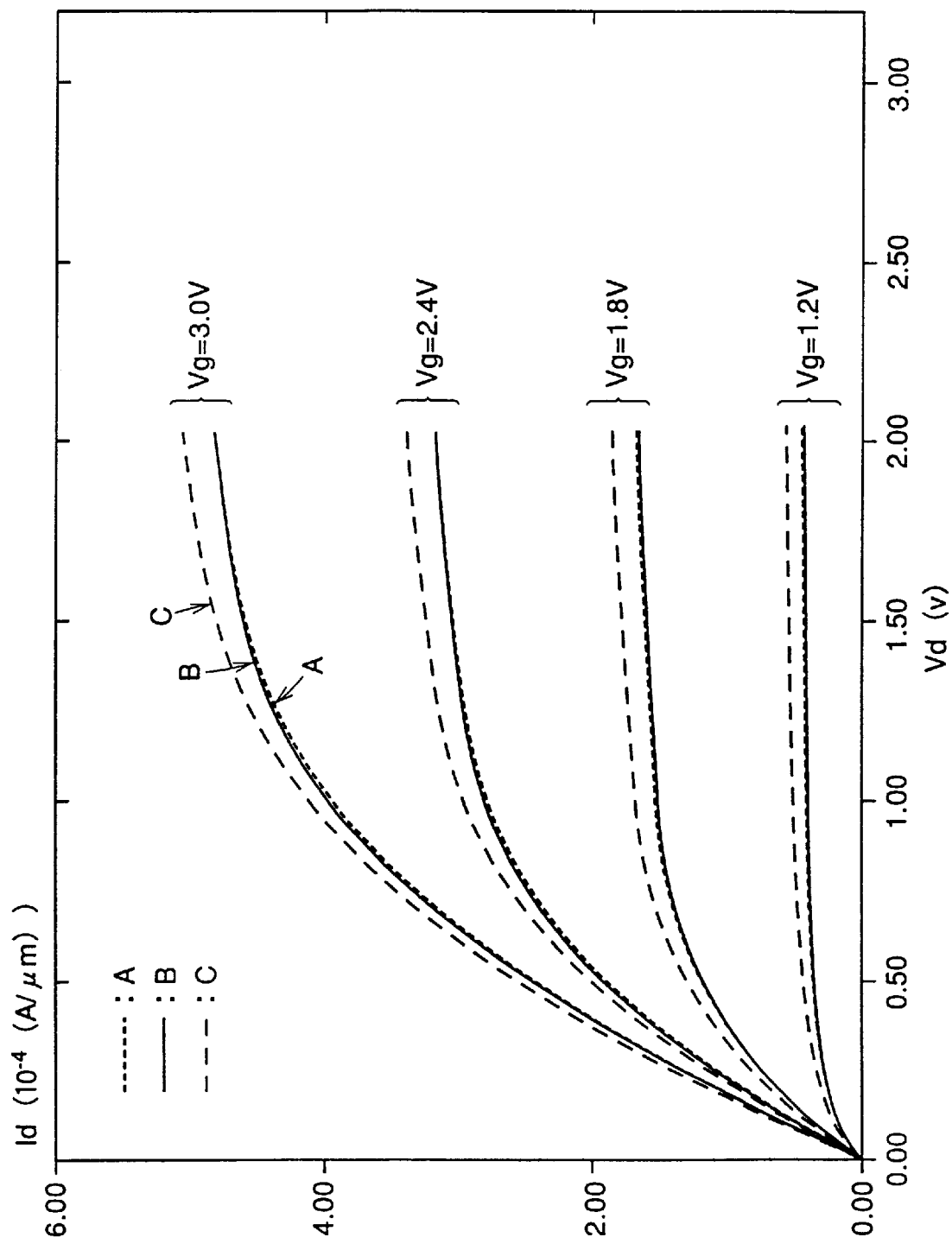
FIG. 19 shows a simulation result of drain voltage-drain current characteristics of a field effect transistor of the implementation of the present invention, conventional implementation, and comparative implementation.

FIG. 19 shows the simulation results of the drain voltage-drain current (Vd-Id) characteristics of the implementation of the present invention (A), the conventional implementation (B), and the comparative implementation (C). It is appreciated from FIG. 19 that (A) and (B) show similar characteristics, and are not adversely affected by the impurity concentration profile. In contrast, (C) indicates a greater ratio of increase in the drain current over the drain voltage in all the gate voltages (Vg). The drain voltage-drain current characteristic in (C) is deteriorated.

Figure 20:
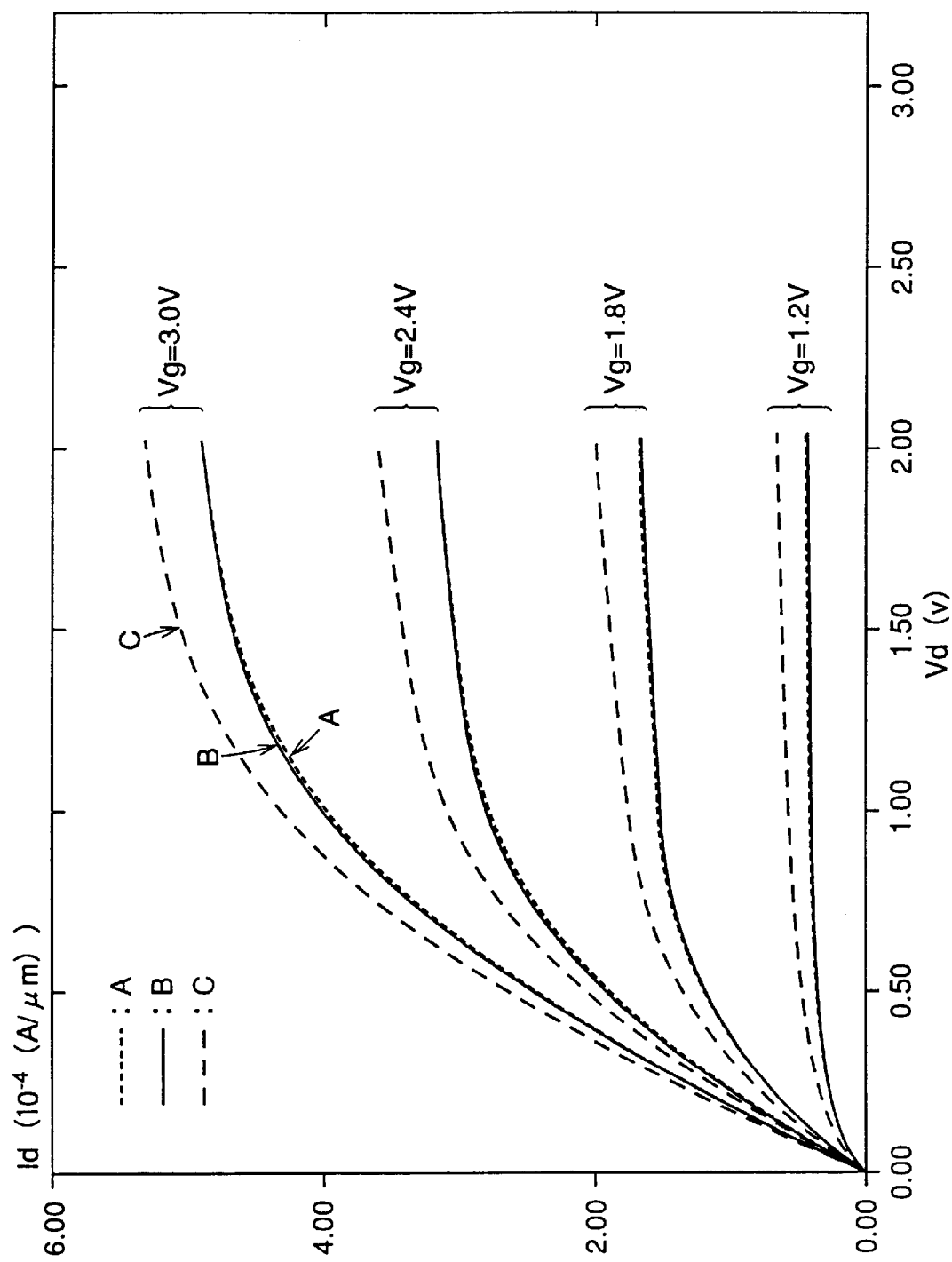
FIG. 20 shows a simulation result of drain voltage-drain current characteristics of a field effect transistor of the implementation of the present invention, conventional implementation, and comparative implementation when the position of the contact is shifted.
Figure 21:
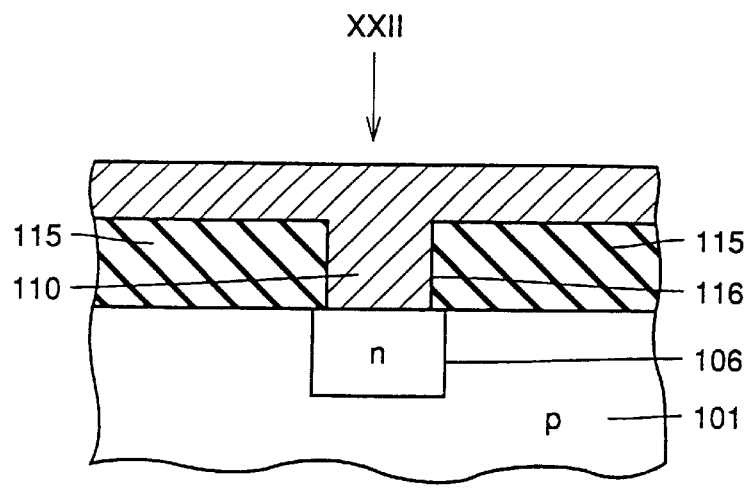
FIG. 21 is a partial sectional view showing a semiconductor device with a conventional contact structure.
Figure 22:
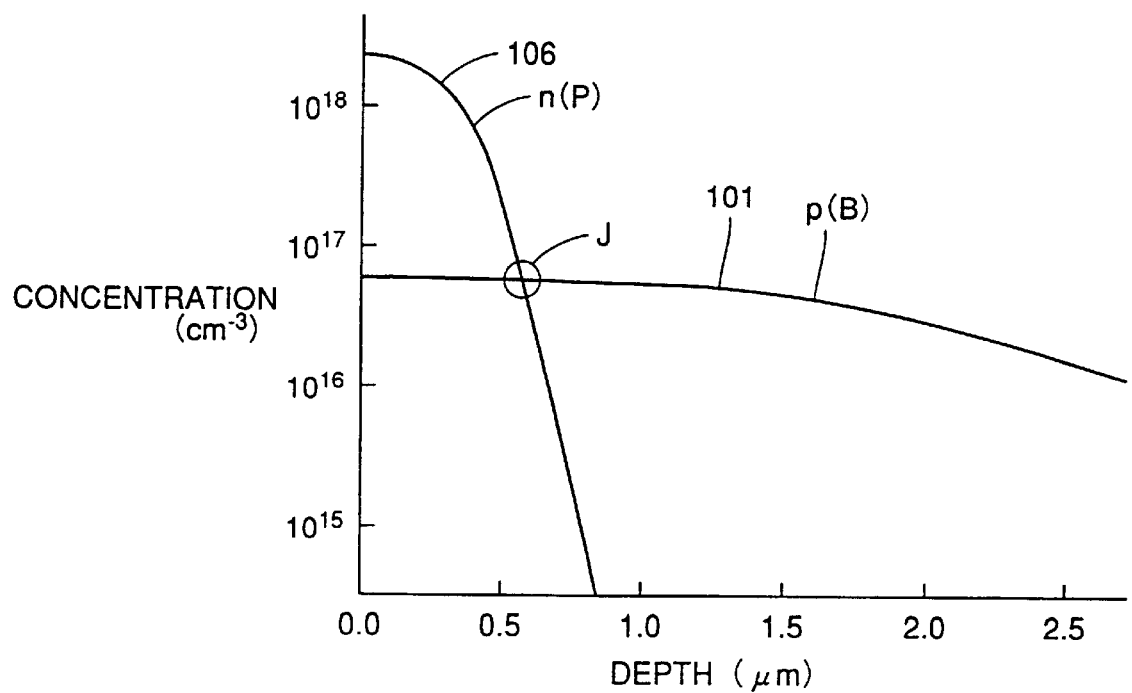
FIG. 22 shows an impurity concentration profile at position XXII of FIG. 21.
Figure 23:
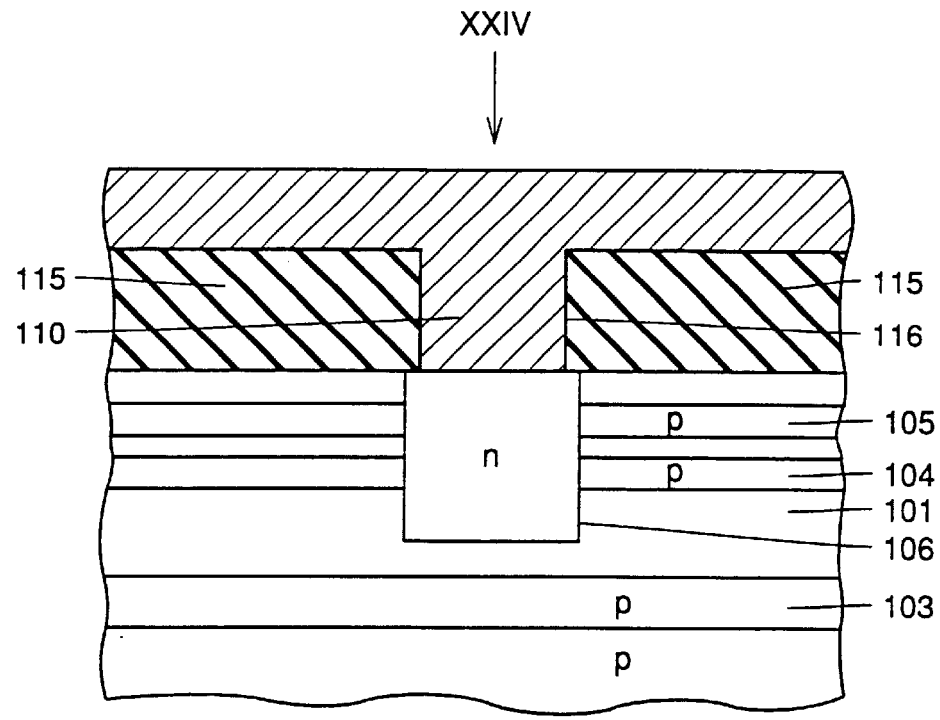
FIG. 23 is a partial sectional view showing a semiconductor device with an improved comparative contact structure.
Figure 24:
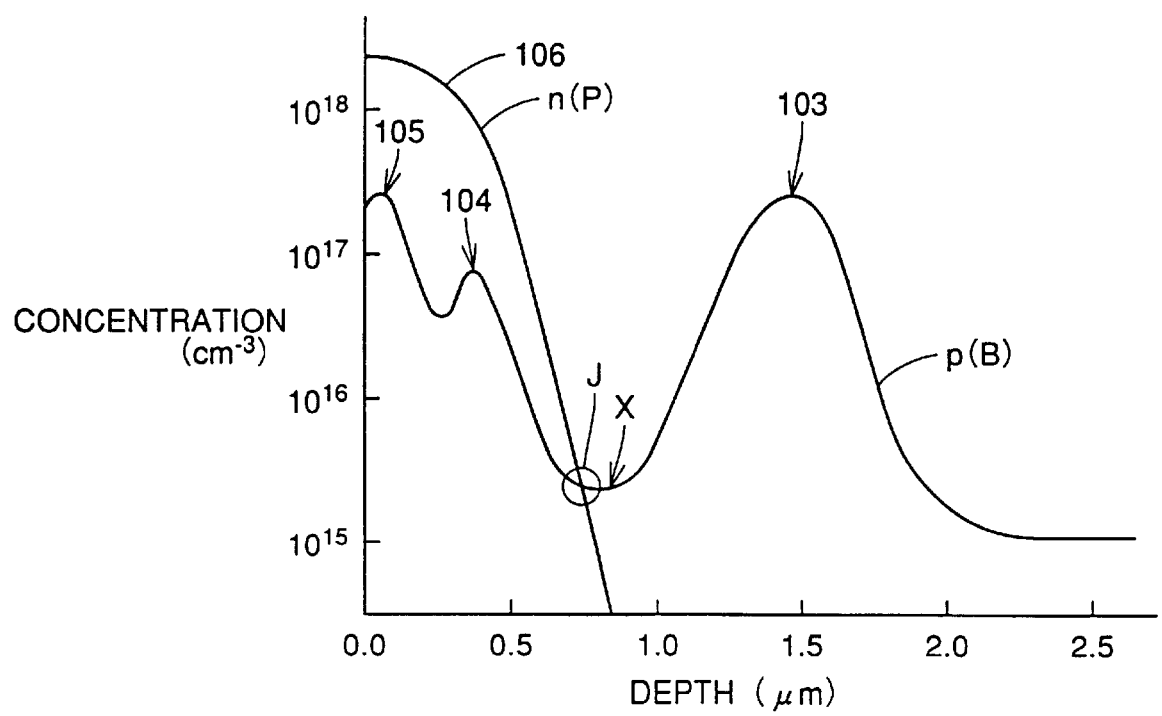
FIG. 24 shows an impurity concentration profile at position XXIV of FIG. 23.
Figure 25:
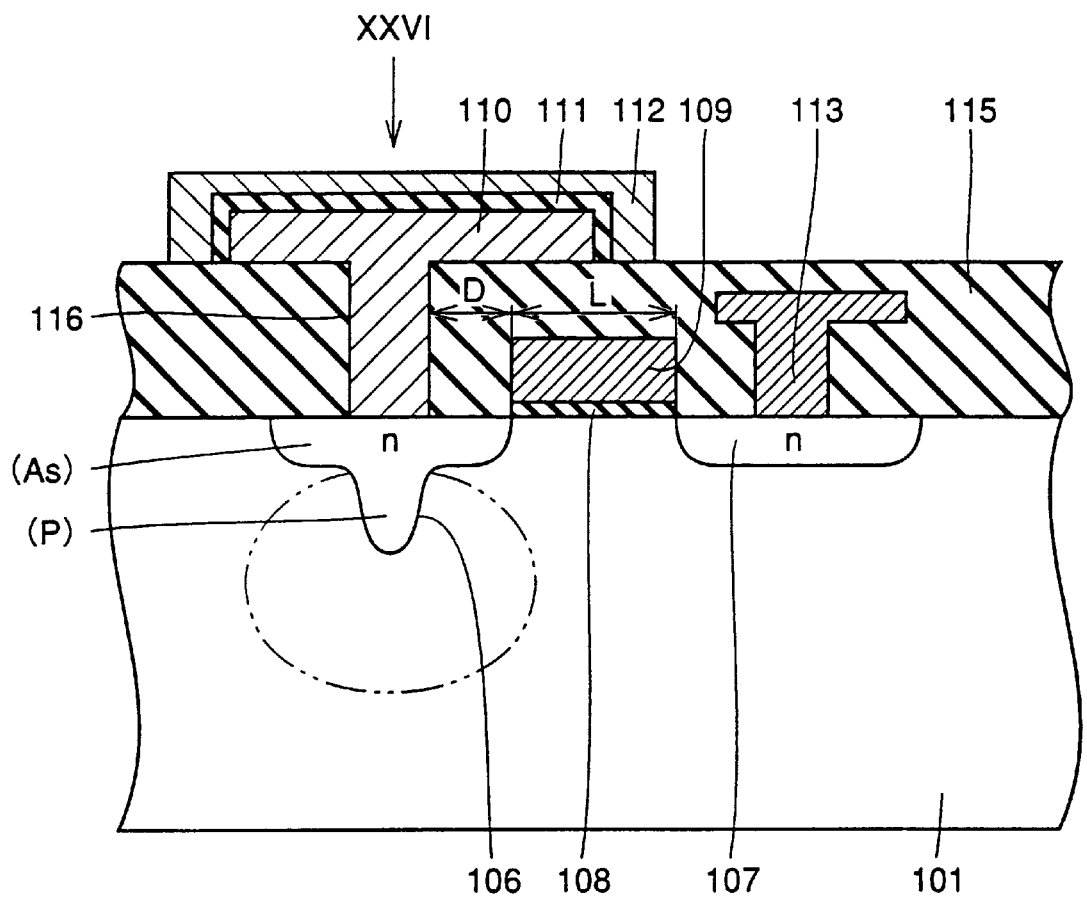
FIG. 25 is a partial sectional view showing a memory region of a DRAM including an improved comparative contact structure.
Figure 26:
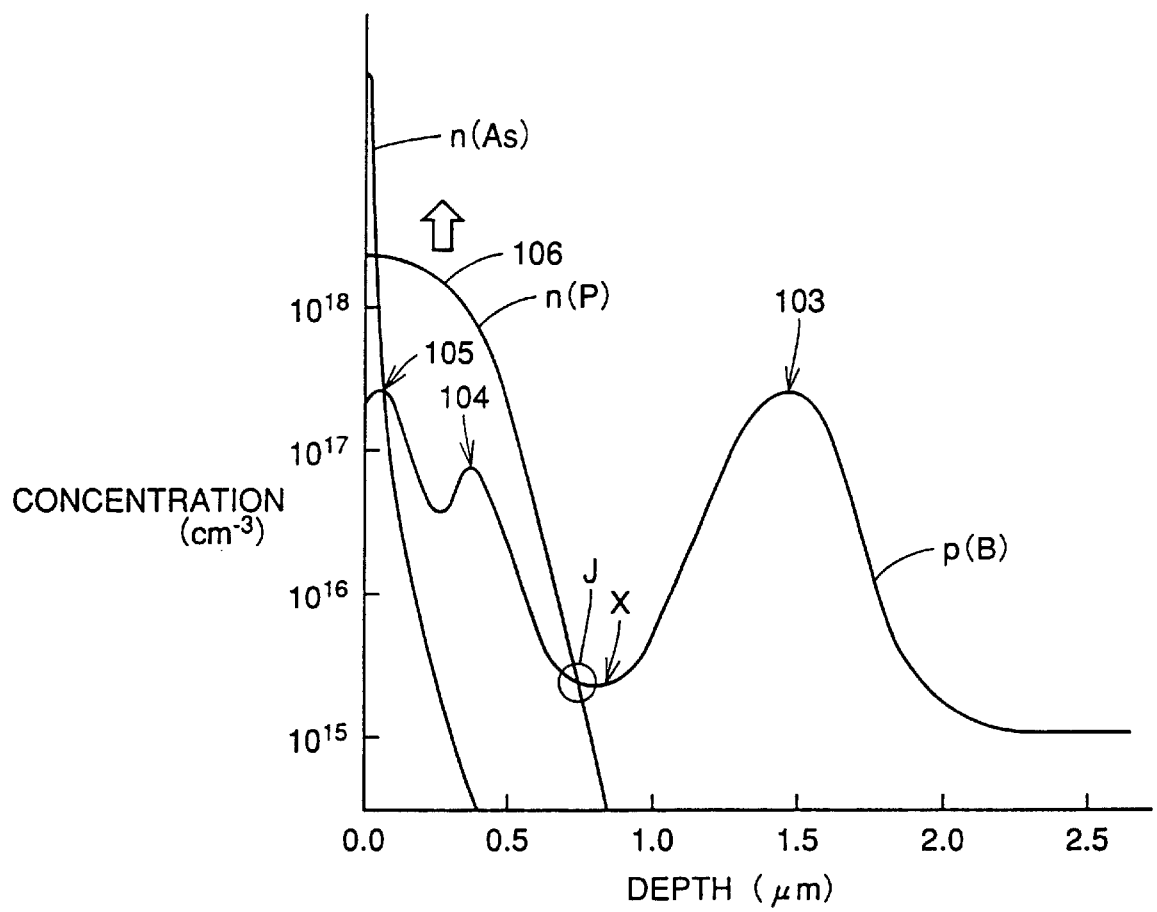
FIG. 26 shows an impurity concentration profile at position XXVI of FIG. 25.

Similar to FIG. 18, FIG. 20 shows the simulation results of the drain voltage-drain current (Vd-Id) characteristics of the implementation of the present invention (A), the conventional implementation (B) and the comparative implementation (C) when the position of the contact is shifted 0.025 $\mu$m towards gate electrode 9 with respect to n type source/drain region 6 of electrode 17. It is appreciated from FIG. 20 that (A) and (B) maintain the proper drain voltage-drain current characteristics. In contrast, (C) shows a great increase of the ratio of the drain current over the drain voltage in all the gate voltages (Vg). The drain voltage-drain current characteristic thereof is deteriorated.

According to the above simulation results, it is appreciated that comparative implementation (C) improved in the pn junction breakdown voltage and mitigated in the electric field with respect to conventional implementation (B) is susceptible to the impurity concentration profile, and results in deterioration in the characteristic of the field effect transistor. In contrast, the implementation of the present invention (A) can realize improvement of the breakdown voltage of the pn junction and mitigate the electric field while maintaining the characteristic of the field effect transistor without being adversely affected by the impurity concentration profile.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device comprising the steps of:

forming an element isolation insulation film at a main surface of a semiconductor substrate of a first conductivity type, a first implantation step of ion-implanting impurities of the first conductivity type at a first dose from said main surface to a first depth so as to form an impurity region of the first conductivity type for preventing inversion at a region of said semiconductor substrate below said element isolation insulation film, a second implantation step of ion-implanting an impurity of the first conductivity type at a second dose at a second depth smaller than said first depth so as to form an impurity region of the first conductivity type for adjusting a threshold voltage at a region of said semiconductor substrate between said element isolation insulation films, forming a gate electrode with a gate insulation film thereunder at a region of said semiconductor substrate between said element isolation insulation films, forming first and second source/drain regions of a second conductivity type at the main surface of said semiconductor substrate at both sides of said gate electrode, a third implantation step of ion-implanting impurities of the second conductivity type at a third dose attaining an impurity concentration higher than the impurity concentration by said first dose at a neighborhood of said first depth from said main surface at said first source/drain region, and a fourth implantation step of ion-implanting impurities of the second conductivity type at a fourth dose attaining an impurity concentration higher than the impurity concentration by second dose at a neighborhood of said second depth from said main surface at said first source/drain region.

2. The method of manufacturing a semiconductor device according to claim 1, further comprising a fifth implantation step of ion-implanting impurities of the first conductivity type at a third depth deeper than said first depth so as to form a well region of the first conductivity type, prior to said first implantation step.

3. The method of manufacturing a semiconductor device according to claim 1, further comprising the step of forming a conductive layer to come into contact with said first source/drain region.

4. The method of manufacturing a semiconductor device according to claim 1, wherein said third and fourth implantation steps are carried out by ion-implanting impurities through a contact hole formed so as to expose a surface of said first source/drain region.

* * * * *